United States Patent
Yuan et al.

(10) Patent No.: US 12,300,488 B2
(45) Date of Patent: May 13, 2025

(54) DOPED OR UNDOPED SILICON CARBIDE DEPOSITION AND REMOTE HYDROGEN PLASMA EXPOSURE FOR GAPFILL

(71) Applicant: Lam Research Corporation, Fremont, CA (US)

(72) Inventors: Guangbi Yuan, Beaverton, OR (US); Ieva Narkeviciute, Portland, OR (US); Bo Gong, Sherwood, OR (US); Bhadri N. Varadarajan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/501,395

(22) Filed: Nov. 3, 2023

(65) Prior Publication Data

US 2024/0063015 A1    Feb. 22, 2024

Related U.S. Application Data

(63) Continuation of application No. 17/286,407, filed as application No. PCT/US2019/055671 on Oct. 10, 2019, now Pat. No. 11,848,199.

(Continued)

(51) Int. Cl.
*H01L 21/02* (2006.01)
*C23C 16/02* (2006.01)
(Continued)

(52) U.S. Cl.
CPC .... *H01L 21/02274* (2013.01); *C23C 16/0272* (2013.01); *C23C 16/308* (2013.01);
(Continued)

(58) Field of Classification Search
CPC .............. C23C 16/0272; C23C 16/308; C23C 16/45536; H01J 37/32357; H01L 21/02126; H01L 21/0214; H01L 21/02167
See application file for complete search history.

(56) References Cited

U.S. PATENT DOCUMENTS

| 4,532,150 A | 7/1985 | Endo et al. |
| 4,952,658 A | 8/1990 | Kalchauer et al. |

(Continued)

FOREIGN PATENT DOCUMENTS

| CN | 1609156 A | 4/2005 |
| CN | 1714168 A | 12/2005 |

(Continued)

OTHER PUBLICATIONS

Advisory Action dated Aug. 11, 2021, in U.S. Appl. No. 16/044,357.

(Continued)

*Primary Examiner* — Joseph A Miller, Jr.
(74) *Attorney, Agent, or Firm* — Weaver Austin Villeneuve & Sampson LLP

(57) ABSTRACT

A doped or undoped silicon carbide ($SiC_xO_yN_z$) film can be deposited in one or more features of a substrate for gapfill. After a first thickness of the doped or undoped silicon carbide film is deposited in the one or more features, the doped or undoped silicon carbide film is exposed to a remote hydrogen plasma under conditions that cause a size of an opening near a top surface of each of the one or more features to increase, where the conditions can be controlled by controlling treatment time, treatment frequency, treatment power, and/or remote plasma gas composition. Operations of depositing additional thicknesses of silicon carbide film and performing a remote hydrogen plasma treatment are repeated to at least substantially fill the one or more features. Various time intervals between deposition and plasma treatment may be added to modulate gapfill performance.

20 Claims, 9 Drawing Sheets

Related U.S. Application Data

(60) Provisional application No. 62/748,186, filed on Oct. 19, 2018.

(51) Int. Cl.
*C23C 16/30* (2006.01)
*C23C 16/455* (2006.01)
*C23C 16/56* (2006.01)
*H01J 37/32* (2006.01)

(52) U.S. Cl.
CPC .. *C23C 16/45536* (2013.01); *C23C 16/45553* (2013.01); *C23C 16/56* (2013.01); *H01J 37/32357* (2013.01); *H01L 21/02126* (2013.01); *H01L 21/0214* (2013.01); *H01L 21/02167* (2013.01); *H01L 21/0228* (2013.01); *H01J 2237/332* (2013.01)

(56) References Cited

U.S. PATENT DOCUMENTS

| | | |
|---|---|---|
| 5,122,431 A | 6/1992 | Kodama et al. |
| 5,447,816 A | 9/1995 | Kodama et al. |
| 5,518,572 A | 5/1996 | Kinoshita et al. |
| 5,567,243 A | 10/1996 | Foster et al. |
| 5,807,615 A | 9/1998 | Sindzingre et al. |
| 6,013,155 A | 1/2000 | McMillin et al. |
| 6,262,445 B1 | 7/2001 | Swanson et al. |
| 6,365,527 B1 | 4/2002 | Yang et al. |
| 6,383,299 B1 | 5/2002 | Yuda et al. |
| 6,395,150 B1 | 5/2002 | Van et al. |
| 6,447,186 B1 | 9/2002 | Oguchi et al. |
| 6,448,186 B1 | 9/2002 | Olson et al. |
| 6,576,345 B1 | 6/2003 | Van et al. |
| 6,624,064 B1 | 9/2003 | Sahin et al. |
| 6,713,390 B2 | 3/2004 | M'Saad et al. |
| 6,790,788 B2 | 9/2004 | Li et al. |
| 6,846,391 B1 | 1/2005 | Papasouliotis et al. |
| 6,846,745 B1 | 1/2005 | Papasouliotis et al. |
| 6,849,561 B1 | 2/2005 | Goundar |
| 6,851,384 B2 | 2/2005 | Yuda et al. |
| 6,890,850 B2 | 5/2005 | Lee et al. |
| 6,919,270 B2 | 7/2005 | Satoh et al. |
| 6,935,553 B2 | 8/2005 | Suga et al. |
| 6,949,450 B2 | 9/2005 | Chiang et al. |
| 6,991,959 B2 | 1/2006 | Goundar et al. |
| 7,163,896 B1 | 1/2007 | Zhu et al. |
| 7,256,139 B2 | 8/2007 | Moghadam et al. |
| 7,514,375 B1 | 4/2009 | Shanker et al. |
| 7,524,735 B1 | 4/2009 | Gauri et al. |
| 7,582,555 B1 | 9/2009 | Lang et al. |
| 7,622,400 B1 | 11/2009 | Fox et al. |
| 7,648,899 B1 | 1/2010 | Banerji et al. |
| 7,662,355 B2 | 2/2010 | Kamisako et al. |
| 7,695,765 B1 | 4/2010 | Fox et al. |
| 7,709,063 B2 | 5/2010 | Yuda et al. |
| 7,736,728 B2 | 6/2010 | Loboda et al. |
| 7,915,166 B1 | 3/2011 | Yu et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,168,268 B2 | 5/2012 | Ovshinsky |
| 8,178,168 B2 | 5/2012 | O'Neill et al. |
| 8,217,513 B2 | 7/2012 | Antonelli et al. |
| 8,864,935 B2 | 10/2014 | Fair et al. |
| 8,916,022 B1 | 12/2014 | Caron |
| 8,927,442 B1 | 1/2015 | Angyal et al. |
| 9,234,276 B2 | 1/2016 | Varadarajan |
| 9,371,579 B2 | 6/2016 | Varadarajan et al. |
| 9,382,268 B1 | 7/2016 | Kuchenbeiser et al. |
| 9,391,086 B1 | 7/2016 | Soda et al. |
| 9,591,738 B2 | 3/2017 | Qiu et al. |
| 9,837,270 B1 | 12/2017 | Varadarajan et al. |
| 10,002,787 B2 | 6/2018 | Yu et al. |
| 10,211,310 B2 | 2/2019 | Varadarajan |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 10,832,904 B2 | 11/2020 | Varadarajan |
| 10,840,087 B2 | 11/2020 | Weimer et al. |
| 11,049,716 B2 | 6/2021 | Tang et al. |
| 11,264,234 B2 | 3/2022 | Varadarajan et al. |
| 11,680,314 B2 | 6/2023 | Varadarajan |
| 11,680,315 B2 | 6/2023 | Varadarajan |
| 11,708,634 B2 | 7/2023 | Varadarajan |
| 11,732,350 B2 | 8/2023 | Varadarajan |
| 11,848,199 B2 | 12/2023 | Yuan et al. |
| 11,894,227 B2 | 2/2024 | Varadarajan et al. |
| 2001/0012667 A1 | 8/2001 | Ma et al. |
| 2002/0000202 A1 | 1/2002 | Yuda et al. |
| 2002/0039625 A1 | 4/2002 | Powell et al. |
| 2002/0106891 A1 | 8/2002 | Kim et al. |
| 2002/0132101 A1 | 9/2002 | Fonash et al. |
| 2003/0008528 A1 | 1/2003 | Xia et al. |
| 2003/0036272 A1 | 2/2003 | Shamouilian et al. |
| 2003/0064154 A1 | 4/2003 | Laxman et al. |
| 2003/0113995 A1 | 6/2003 | Xia et al. |
| 2003/0139035 A1 | 7/2003 | Yim et al. |
| 2003/0154141 A1 | 8/2003 | Capazario et al. |
| 2003/0176030 A1 | 9/2003 | Tsuji et al. |
| 2003/0194496 A1 | 10/2003 | Xu et al. |
| 2003/0232504 A1 | 12/2003 | Eppler et al. |
| 2004/0050328 A1 | 3/2004 | Kumagai et al. |
| 2004/0067308 A1 | 4/2004 | Zheng et al. |
| 2004/0084680 A1 | 5/2004 | Ruelke et al. |
| 2004/0086434 A1 | 5/2004 | Gadgil et al. |
| 2004/0089924 A1 | 5/2004 | Yuasa et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0161535 A1 | 8/2004 | Goundar et al. |
| 2004/0180557 A1 | 9/2004 | Park et al. |
| 2004/0194706 A1 | 10/2004 | Wang et al. |
| 2004/0197474 A1 | 10/2004 | Vrtis et al. |
| 2004/0232552 A1 | 11/2004 | Wang et al. |
| 2004/0253777 A1 | 12/2004 | Miyoshi et al. |
| 2005/0014315 A1 | 1/2005 | Yamamoto et al. |
| 2005/0100682 A1 | 5/2005 | Fukiage et al. |
| 2005/0130404 A1 | 6/2005 | Moghadam et al. |
| 2005/0202685 A1 | 9/2005 | Huang et al. |
| 2005/0211170 A1 | 9/2005 | Hanawa et al. |
| 2005/0230831 A1 | 10/2005 | Clevenger et al. |
| 2005/0255714 A1 | 11/2005 | Iyer et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0046520 A1 | 3/2006 | Padhi et al. |
| 2006/0091559 A1 | 5/2006 | Nguyen et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2006/0278952 A1 | 12/2006 | Mori et al. |
| 2007/0004204 A1 | 1/2007 | Fukazawa et al. |
| 2007/0141812 A1 | 6/2007 | Zagwijn et al. |
| 2007/0173071 A1 | 7/2007 | Afzali-Ardakani et al. |
| 2007/0190266 A1 | 8/2007 | Fu |
| 2007/0281496 A1 | 12/2007 | Ingle et al. |
| 2008/0064173 A1 | 3/2008 | Hung |
| 2008/0090022 A1 | 4/2008 | Ovshinsky |
| 2008/0132087 A1 | 6/2008 | Xia et al. |
| 2008/0156264 A1 | 7/2008 | Fair et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1 | 3/2009 | Nukui et al. |
| 2009/0093132 A1 | 4/2009 | Xu et al. |
| 2009/0095334 A1 | 4/2009 | Huston |

(56) References Cited

U.S. PATENT DOCUMENTS

| | | |
|---|---|---|
| 2009/0218699 A1 | 9/2009 | Torres et al. |
| 2009/0258487 A1 | 10/2009 | Lin et al. |
| 2009/0264277 A1 | 10/2009 | Raj et al. |
| 2009/0325364 A1 | 12/2009 | Sasagawa et al. |
| 2010/0025370 A1 | 2/2010 | Dieguez-Campo et al. |
| 2010/0075077 A1 | 3/2010 | Bicker et al. |
| 2010/0081293 A1 | 4/2010 | Mallick et al. |
| 2010/0099264 A1 | 4/2010 | Elers |
| 2010/0136789 A1 | 6/2010 | Matz et al. |
| 2010/0181654 A1 | 7/2010 | Fujiwara et al. |
| 2010/0207274 A1 | 8/2010 | Hayashi et al. |
| 2010/0224322 A1 | 9/2010 | Sui et al. |
| 2010/0255667 A1 | 10/2010 | Seino et al. |
| 2010/0308463 A1 | 12/2010 | Yu et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0111533 A1 | 5/2011 | Varadarajan et al. |
| 2011/0114994 A1 | 5/2011 | Mandlik et al. |
| 2011/0117678 A1 | 5/2011 | Varadarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0217844 A1 | 9/2011 | Satou |
| 2011/0236594 A1 | 9/2011 | Haverkamp et al. |
| 2011/0244694 A1 | 10/2011 | Antonelli et al. |
| 2011/0256726 A1 | 10/2011 | LaVoie et al. |
| 2012/0009802 A1 | 1/2012 | LaVoie et al. |
| 2012/0077349 A1 | 3/2012 | Li et al. |
| 2012/0080779 A1 | 4/2012 | Seamons et al. |
| 2012/0119283 A1 | 5/2012 | Lee et al. |
| 2012/0122302 A1 | 5/2012 | Weidman et al. |
| 2012/0142172 A1 | 6/2012 | Fox et al. |
| 2012/0149213 A1 | 6/2012 | Nittala et al. |
| 2012/0214318 A1 | 8/2012 | Fukazawa et al. |
| 2012/0282756 A1 | 11/2012 | Meng |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Iino et al. |
| 2013/0075455 A1 | 3/2013 | Shimizu |
| 2013/0084711 A1 | 4/2013 | Liang et al. |
| 2013/0119406 A1 | 5/2013 | Notsu et al. |
| 2013/0129940 A1 | 5/2013 | Xiao et al. |
| 2013/0183835 A1 | 7/2013 | Nguyen et al. |
| 2013/0217239 A1 | 8/2013 | Mallick et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0132466 A1 | 5/2014 | Inoue et al. |
| 2014/0134827 A1 | 5/2014 | Swaminathan et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |
| 2015/0110968 A1 | 4/2015 | LaVoie et al. |
| 2015/0118394 A1 | 4/2015 | Varadarajan et al. |
| 2015/0179466 A1 | 6/2015 | Takayama et al. |
| 2015/0214015 A1 | 7/2015 | Kikuchi et al. |
| 2015/0249007 A1 | 9/2015 | Xiao et al. |
| 2015/0303056 A1 | 10/2015 | Varadarajan et al. |
| 2015/0329965 A1 | 11/2015 | Gadgil et al. |
| 2016/0020089 A1 | 1/2016 | Thadani et al. |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2016/0358804 A1 | 12/2016 | Kulshreshtha et al. |
| 2017/0062218 A1 | 3/2017 | Duan et al. |
| 2017/0140924 A1 | 5/2017 | Suzuki et al. |
| 2017/0140925 A1 | 5/2017 | Suzuki et al. |
| 2017/0221718 A1 | 8/2017 | Tapily |
| 2017/0365462 A1 | 12/2017 | Varadarajan |
| 2017/0372919 A1 | 12/2017 | Manna et al. |
| 2018/0033614 A1 | 2/2018 | Chandra et al. |
| 2018/0061636 A1 | 3/2018 | Li et al. |
| 2018/0096842 A1 | 4/2018 | Varadarajan et al. |
| 2018/0144977 A1 | 5/2018 | Yu et al. |
| 2018/0202042 A1 | 7/2018 | Fafard et al. |
| 2018/0240664 A9 | 8/2018 | Varadarajan et al. |
| 2018/0247858 A1 | 8/2018 | Nakaya et al. |
| 2018/0330939 A1 | 11/2018 | Pore |
| 2018/0330945 A1 | 11/2018 | Varadarajan et al. |
| 2018/0330985 A1 | 11/2018 | Yu et al. |
| 2018/0347035 A1 | 12/2018 | Weimer et al. |
| 2019/0181004 A1 | 6/2019 | Tang et al. |
| 2019/0259604 A1 | 8/2019 | Varadarajan et al. |
| 2019/0382885 A1 | 12/2019 | Varadarajan |
| 2020/0027725 A1 | 1/2020 | Weimer et al. |
| 2021/0391171 A1 | 12/2021 | Yuan et al. |
| 2022/0098727 A1 | 3/2022 | Varadarajan |
| 2022/0148875 A1 | 5/2022 | Varadarajan et al. |
| 2022/0220608 A1 | 7/2022 | Varadarajan |
| 2022/0220609 A1 | 7/2022 | Varadarajan |
| 2022/0220610 A1 | 7/2022 | Varadarajan |
| 2022/0220611 A1 | 7/2022 | Varadarajan |
| 2022/0238333 A1 | 7/2022 | Yuan et al. |
| 2022/0238334 A1 | 7/2022 | Yuan et al. |
| 2023/0203646 A1 | 6/2023 | Weimer et al. |
| 2024/0145234 A1 | 5/2024 | Varadarajan et al. |

FOREIGN PATENT DOCUMENTS

| | | |
|---|---|---|
| CN | 1735945 A | 2/2006 |
| CN | 101017834 A | 8/2007 |
| CN | 101065834 A | 10/2007 |
| CN | 102171796 A | 8/2011 |
| CN | 102187450 A | 9/2011 |
| CN | 102468283 A | 5/2012 |
| CN | 102468434 A | 5/2012 |
| CN | 102652353 A | 8/2012 |
| CN | 102892922 A | 1/2013 |
| CN | 103168344 A | 6/2013 |
| CN | 104561934 A | 4/2015 |
| CN | 105185707 A | 12/2015 |
| CN | 105862010 A | 8/2016 |
| CN | 106024673 A | 10/2016 |
| CN | 106067440 A | 11/2016 |
| CN | 106711025 A | 5/2017 |
| CN | 107667187 A | 2/2018 |
| CN | 107833825 A | 3/2018 |
| CN | 108028179 A | 5/2018 |
| CN | 108140545 A | 6/2018 |
| CN | 108504996 A | 9/2018 |
| CN | 108603287 A | 9/2018 |
| CN | 109791871 A | 5/2019 |
| EP | 1164628 A2 | 12/2001 |
| JP | 2004006332 A | 1/2004 |
| JP | 2005051096 A | 2/2005 |
| JP | 2006351694 A | 12/2006 |
| JP | 2007194639 A | 8/2007 |
| JP | 2009295617 A | 12/2009 |
| JP | 2013102174 A | 5/2013 |
| JP | 2017092475 A | 5/2017 |
| JP | 2020502797 A | 1/2020 |
| KR | 20010112652 A | 12/2001 |
| KR | 20020058594 A | 7/2002 |
| KR | 20030007721 A | 1/2003 |
| KR | 20040036551 A | 4/2004 |
| KR | 20040068586 A | 7/2004 |
| KR | 20050002525 A | 1/2005 |
| KR | 20080110967 A | 12/2008 |
| KR | 20090019865 A | 2/2009 |
| KR | 20090106112 A | 10/2009 |
| KR | 20110021743 A | 3/2011 |
| KR | 20110082025 A | 7/2011 |

(56) References Cited

FOREIGN PATENT DOCUMENTS

| | | |
|---|---|---|
| KR | 20110093251 A | 8/2011 |
| KR | 20110094205 A | 8/2011 |
| KR | 20110134521 A | 12/2011 |
| KR | 101122458 B1 | 2/2012 |
| KR | 20120053003 A | 5/2012 |
| KR | 20120053331 A | 5/2012 |
| KR | 20120060781 A | 6/2012 |
| KR | 20120132403 A | 12/2012 |
| KR | 20130032343 A | 4/2013 |
| KR | 20130062256 A | 6/2013 |
| KR | 101334640 B1 | 11/2013 |
| KR | 20130139188 A | 12/2013 |
| KR | 20140114047 A | 9/2014 |
| KR | 20140141533 A | 12/2014 |
| KR | 20150047439 A | 5/2015 |
| KR | 20150072342 A | 6/2015 |
| KR | 20150079495 A | 7/2015 |
| KR | 20160016712 A | 2/2016 |
| KR | 20160061002 A | 5/2016 |
| KR | 20160095631 A | 8/2016 |
| KR | 20160097149 A | 8/2016 |
| KR | 20160125310 A | 10/2016 |
| KR | 20180035929 A | 4/2018 |
| KR | 20180043393 A | 4/2018 |
| KR | 20180099476 A | 9/2018 |
| TW | 261689 B | 11/1995 |
| TW | 476807 B | 2/2002 |
| TW | 200600984 A | 1/2006 |
| TW | 200903635 A | 1/2009 |
| TW | 201124553 A | 7/2011 |
| TW | 201214563 A | 4/2012 |
| TW | 201405659 A | 2/2014 |
| TW | 201426818 A | 7/2014 |
| TW | 201510268 A | 3/2015 |
| TW | 201629253 A | 8/2016 |
| TW | 201704513 A | 2/2017 |
| TW | 201706439 A | 2/2017 |
| TW | 201732873 A | 9/2017 |
| TW | 201823159 A | 7/2018 |
| WO | WO-03052162 A1 | 6/2003 |
| WO | WO-2010132579 A2 | 11/2010 |
| WO | WO-2011011532 A2 | 1/2011 |
| WO | WO-2011109148 A2 | 9/2011 |
| WO | WO-2017049253 A1 | 3/2017 |
| WO | WO-2018063825 A1 | 4/2018 |
| WO | WO-2018111570 A1 | 6/2018 |

OTHER PUBLICATIONS

Benilan et al., (Oct. 4, 2011) "Optimization of microwave Hydrogen plasma discharges to mimic Lyman α(121.6 nm) solar irradiations," EPSC-DPS2011-1317, EPSC-DPJ Joint Meeting 2011, EPSC Abstracts, 6:2pp.
Bishop C., "Atomic Layer Deposition," Vacuum Deposition onto Webs, 2011, 2nd Edition, Chapter 19, pp. 331-336.
Blaszczyk-Lezak I., et al., "Silicon Carbonitride Films Produced by Remote Hydrogen Microwave Plasma CVD Using a (Dimethylamino) Dimethylsilane Precursor," Chemical Vapor Deposition, 2005, vol. 11 (1), pp. 44-52.
Boo et al., (1999) "Growth of boron nitride thin films on silicon substrates using new organoboron precursors" Phys. Stat. sol. (a), vol. 176. Nov. 1999, pp. 705-710.
Chinese Fifth Office Action dated May 8, 2021 issued in Application No. CN 201610084166.5.
Chinese First Office Action dated Dec. 20, 2018 issued in Application No. CN 201710307116.3.
Chinese First Office Action dated Jan. 3, 2018 issued in Application No. CN 201610084166.5.
Chinese First Office Action dated Jun. 25, 2018 issued in Application No. CN 201610251266.2.
Chinese First Office Action dated Nov. 19, 2020 issued in Application No. CN 201710812595.4.
Chinese First Office Action dated Sep. 5, 2016 issued in Application No. CN 201410576747.1.
Chinese Fourth Office Action dated Mar. 1, 2021 issued in Application No. CN 201610084166.5.
Chinese Reexamination Decision dated Apr. 8, 2020 issued in Application No. 201610251266.2.
Chinese Second Office Action dated Jun. 3, 2019 issued in Application No. CN 201710307116.3.
Chinese Second Office Action dated May 6, 2021 issued in Application No. CN 201710812595.4.
Chinese Second Office Action dated Oct. 12, 2018 issued in Application No. CN 201610084166.5.
Chinese Second Office Action [Decision of Final Rejection] dated Jan. 25, 2019 issued in Application No. CN 201610251266.2.
Chinese Third Office Action dated Apr. 22, 2019 issued in Application No. CN 201610084166.5.
Chinese Third Office Action dated Dec. 9, 2019 issued in Application No. CN 201710307116.3.
CN Office Action dated Apr. 17, 2023, in Application No. CN201980049405.5 with English translation.
CN Office Action dated Apr. 28, 2023, in Application No. CN201980084273.X with English translation.
CN Office Action dated Dec. 2, 2022, in Application No. CN201710812595.4 with English translation.
CN Office Action dated Jul. 20, 2022, in application No. CN201710812595.4 with English translation.
CN Office Action dated Mar. 29, 2022, in application No. CN201710812595.4 with English translation.
CN Office Action dated May 7, 2023, in Application No. CN201980058950 with English translation.
CN Office Action dated May 11, 2023, in Application No. CN201780060918.7 with English translation.
CN Office Action dated May 31, 2023, in application No. CN20178072499 with English translation.
CN Office Action dated Nov. 1, 2022 in Application No. CN20198058950 With English translation.
CN Office Action dated Nov. 17, 2022, in Application No. CN201780072499.9 with English translation.
CN Office Action dated Nov. 24, 2022 in Application No. CN201980049405.5 with English translation.
CN Office Action dated Nov. 25, 2022 in Application No. CN201980084273.X with English translation.
CN Office Action dated Nov. 29, 2022 in Application No. CN201780060918.7 with English translation.
CN Office Action dated Sep. 1, 2023, in Application No. CN201780060918.7 with English translation.
CN Office Action dated Sep. 9, 2023, in Application No. CN201980084273.X with English translation.
CN Office Action dated Sep. 11, 2023, in application No. CN202110901818.0 with English translation.
CN Office Action dated Sep. 22, 2022, in Application No. CN201780086632.6 with English translation.
CN Office Action dated Sep. 3, 2021, in application No. CN201710812595.4 with English translation.
"Development of Current Atomic Theory," Emission Spectrum of Hydrogen, [downloaded at http://chemed.chem.purdue.edu/genchem/topicreview/bp/ch6/bohr.html on Sep. 23, 15], 7 pp.
"Dummies' Guide to Hydrogen," Molecular Hydrogen Foundation, MHF, [downloaded at http://www.molecularhydrogenfoundation.org/core-information/dummies-guide-to-hydrogen on Sep. 23, 15], 2 pp.
Fozza et al., (Jan./Feb. 1998) "Vacuum ultraviolet to visible emission of some pure gases and their mixtures used for plasma processing," J. Vac. Sci. Technol. A, American Vacuum Society, 16(1):72-77.
Fozza et al., (Jul. 2000) "Vacuum ultraviolet to visible emission from hydrogen plasma: Effect of excitation frequency," Journal of Applied Physics, 88(1):20-33.
G.E. Coates et al., "Chapter Four: Organometallic compounds of elements of main groups IV and V," Principles of Organometallic Chemistry, (1968) pp. 121-122.

(56) References Cited

OTHER PUBLICATIONS

Grubbs et al. (May/Jun. 2006) "Attenuation of hydrogen radicals traveling under flowing gas conditions through tubes of different materials," J. Vac. Sci. Technol. A, 24(3):486-496.
Hatanaka et al., (2000) "Experiments and analyses of SiC thin film deposition from organo-silicon by a remote plasma method," Thin Solid Films, 368:287-291.
Holländer et al., (May 1994) "Vacuum ultraviolet emission from microwave plasmas of hydrogen and its mixtures with helium and oxygen," J. Vac. Sci. Technol. A, 12(3):879-882.
Huran, J., et al., (2004) "RBS study of amorphous silicon carbide films deposited by PECVD," Czechoslovak Journal of Physics, 54(Suppl. C):C1006-C1010.
International Preliminary Report on Patentability dated Apr. 29, 2021 (ISA/KR) issued in Application No. PCT/US2019/055671.
International Preliminary Report on Patentability dated Feb. 4, 2021 (ISA/KR) issued in Application No. PCT/US2019/042413.
International Preliminary Report on Patentability dated Feb. 4, 2021 (ISA/KR) issued in Application No. PCT/US2019/042812.
International Preliminary Report on Patentability dated Feb. 4, 2021 (ISA/KR) issued in PCT/US2019/042821.
International Search Report and Written Opinion dated Jan. 31, 2020 (ISA/KR) issued in Application No. PCT/US2019/055671.
International Search Report and Written Opinion dated Mar. 15, 2018 in Application No. PCT/US2017/062882.
International Search Report and Written Opinion dated Nov. 20, 2019 (ISA/KR) issued in PCT/US2019/042812.
International Search Report and Written Opinion dated Nov. 8, 2019 (ISA/KR) issued in PCT/US2019/042821.
International Search Report and Written Opinion dated Oct. 25, 2019 (ISA/KR) issued in Application No. PCT/US2019/042413.
Jones et al., (Nov. 30, 2001) "Silicon Containing Polymers: The Science and Technology of Their Synthesis and Applications," Springer, p. 705.
JP Office Action dated Oct. 31, 2023 in Application No. JP2021-521282 with English Translation.
Kikuchi, Y., et al., "Ultra Low-k Non-Porous SiOCH Film (k 2.2) Formed by Ultra Precise Molecular Control in Polymerization Synthesis by Using Large-Radius Neutral-Beam-Enhanced CVD," International Conference on Solid State Devices and Materials, 2013, pp. 856-857.
Korean Decision for Grant dated Aug. 1, 2020 issued in Application No. KR 2014-0066922.
Korean Decision for Grant of Patent dated Dec. 27, 2019 issued in Application No. KR 10-2013-0066728.
Korean Decision Grant of Patent for Application No. KR 10-2020-0143459 dated Jul. 20, 2021.
Korean First Office Action dated Aug. 26, 2021 issued in Application No. KR 10-2017-0115040.
Korean First Office Action dated Aug. 9, 2019 issued in Application No. KR 10-2013-0066728.
Korean First Office Action dated Jan. 18, 2021 issued in Application No. KR 10-2020-0143459.
Korean First Office Action dated May 9, 2020 issued in Application No. KR 2014-0066922.
Korean First Office Action for Application No. KR 10-2014-0144392, dated Jun. 1, 2021.
KR Office Action dated Aug. 5, 2022 in Application No. KR10-2021-7015119 With English translation.
KR Office Action dated Jun. 23, 2022 in Application No. KR10-2019-7019853 with english translation.
KR Office Action dated Sep. 20, 2022, in Application No. KR10-2021-7005461 with English translation.
KR Office Action dated Aug. 3, 2022 in Application No. KR10-2022-0017600 With English translation.
KR Office Action dated Aug. 4, 2022, in Application No. KR10-2022-0019130 With English translation.
KR Office Action dated Aug. 24, 2023, in application No. KR10-2019-7017914 with English translation.
KR Office Action dated Aug. 31, 2022 in Application No. KR10-2016-0014278 with English translation.
KR Office Action dated Dec. 5, 2022 in Application No. KR10-2022-7032867 WithEnglish Translation.
KR Office Action dated Dec. 7, 2021, in Application No. KR1020210140454 with English translation.
KR Office Action dated Feb. 8, 2023, in Application No. KR10-2016-0048396 with English translation.
KR Office Action dated Feb. 11, 2022, in Application No. KR1020170115040 with English translation.
KR Office Action dated Feb. 27, 2023, in Application No. KR10-2019-7017914 with English translation.
KR Office Action dated Jan. 6, 2022, in Application No. KR1020140144392 with English translation.
KR Office Action dated Jan. 27, 2023 in Application No. KR10-2022-0042654 with English translation.
KR Office Action dated Jul. 20, 2022, in Application No. KR10-2019-7017914 With English translation.
KR Office Action dated Jul. 20, 2022, in Application No. KR10-2022-7018307 with English translation.
KR Office Action dated Jul. 31, 2023, in application No. KR10-2016-0014278 with English translation.
KR Office Action dated Jun. 21, 2022, in Application No. KR10-2022-0029219 with English translation.
KR Office Action dated Jun. 21, 2022, in Application No. KR10-2022-0029223 with English translation.
KR Office Action dated Jun. 21, 2022, in Application No. KR10-2022-0029224 with English translation.
KR Office Action dated Jun. 26, 2022, in Application No. KR10-2022-7018307 with English translation.
KR Office Action dated Jun. 30, 2022 in Application No. KR10-2022-0042654 With English translation.
KR Office Action dated Mar. 15, 2023, in Application No. KR10-2016-0014278 with English translation.
KR Office Action dated May 3, 2022, in Application No. KR1020197012042 with English translation.
KR Office Action dated May 9, 2022 in KR Application No. KR10-2022-0017600 with English translation.
KR Office Action dated Nov. 18, 2022 in Application No. KR10-2021-7015119 with English Translation.
KR Office Action dated Nov. 18, 2022 in Application No. KR10-2022-7013124 with English translation.
KR Office Action dated Nov. 18, 2022 in Application No. KR10-2022-7013129 with English translation.
KR office action dated Nov. 25, 2021, in application No. KR20140144392.
KR office action dated Nov. 25, 2021, in application No. KR20197012042 with English translation.
KR Office Action dated Oct. 12, 2022, in Application No. KR10-2022-0029219 with English translation.
KR Office Action dated Oct. 26, 2022, in Application No. KR10-2022-0029224 with English translation.
KR Office Action dated Oct. 28, 2022 in Application No. KR10-20217005460 with English translation.
KR Office Action dated Sep. 30, 2022, in Application No. KR10-2022-7018731 with English translation.
Notice of Allowance dated Oct. 14, 2021 in U.S. Appl. No. 16/400,320.
PCT International Preliminary Report on Patentability dated Apr. 11, 2019 (ISA/KR) issued in PCT/US2017/051794.
PCT International Preliminary Report on Patentability (ISA/KR) dated Jun. 27, 2019 issued in PCT/US2017/064024.
PCT International Preliminary Report on Patentability (ISA/KR) dated Jun. 6, 2019 issued in PCT/US2017/062882.
PCT International Search Report and Written Opinion (ISA/KR) dated Dec. 26, 2017 issued in PCT/US2017/051794.
PCT International Search Report and Written Opinion (ISA/KR) dated Mar. 15, 2018 issued in PCT/US2017/062882.
PCT International Search Report and Written Opinion (ISA/KR) dated Mar. 19, 2018 issued in PCT/US2017/064024.
"Radical (chemistry)" From Wikipedia, the free encyclopedia, [downloaded at http://en.wikipedia.org/wiki/Radical_(chemistry) on Sep. 23, 2015), 11 pages.

(56) References Cited

OTHER PUBLICATIONS

Singapore Notice of Allowance & Supplemental Exam Report dated Nov. 30, 2017 issued in Application No. SG 10201402381U.
Singapore Notice of Eligibility for Grant dated Jan. 11, 2021 issued in Application No. SG 10201600832V.
Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.
Taiwan Notice of Allowance and Search Report dated Jun. 14, 2018 issued in Application No. TW 103136697.
Taiwan Notice of Allowance dated Jan. 8, 2019 issued in Application No. TW 107126975.
Taiwan Office Action dated Dec. 22, 2015 issued in Application No. TW 102120742.
Taiwan Office Action dated Nov. 6, 2017 issued in Application No. TW 103119100.
Taiwanes Third Office Action dated Aug. 21, 2019 issued in Application No. TW 107123391.
Taiwanese First Office Action dated Dec. 24, 2018 issued in Application No. TW 107123391.
Taiwanese First Office Action dated Jul. 31, 2019 issued in Application No. TW 105103396.
Taiwanese First Office Action dated May 13, 2021 issued in Application No. TW 106140423.
Taiwanese Second Office Action dated Apr. 18, 2019 issued in Application No. TW 107123391.
TW Office Action dated Aug. 4, 2023, in application No. TW108125646 with English translation..
TW Office Action dated Aug. 22, 2023, in application No. TW111102313 with English translation.
TW Office Action dated Dec. 29, 2022 in Application No. TW111102313 with English translation.
TW Office Action dated Jul. 7, 2023, in application No. TW108125937 with English translation.
TW Office Action dated Jun. 5, 2023, in Application No. TW108125985 with English translation.
U.S. Non-Final office Action dated Jul. 12, 2022 in U.S. Appl. No. 17/586,505.
U.S. Non-Final office Action dated Oct. 5, 2022 in U.S. Appl. No. 17/704,585.
U.S. Non-Final office Action dated Sep. 7, 2022 in U.S. Appl. No. 17/286,407.
U.S. Office Action dated Oct. 15, 2021, in U.S. Appl. No. 16/044,371.
U.S. Office Action dated Oct. 25, 2021, in U.S. Appl. No. 16/044,357.
U.S. Advisory Action and Examiner Initiated Interview Summary dated Aug. 12, 2015 issued in U.S. Appl. No. 13/907,699.
U.S. Advisory Action dated Jan. 12, 2023, in U.S. Appl. No. 17/658,935.
U.S. Advisory Action dated Jan. 23, 2023 in U.S. Appl. No. 17/658,937.
U.S. Advisory Action dated Mar. 10, 2023 in U.S. Appl. No. 17/704,574.
U.S. Advisory Action dated Mar. 17, 2023 in U.S. Appl. No. 17/586,505.
U.S. Appl. No. 16/240,133, inventors Varadarajan et al., filed Jan. 4, 2019.
U.S. Corrected Notice of Allowability dated Mar. 17, 2021 issued in U.S. Appl. No. 16/194,102.
U.S. Corrected Notice of Allowance dated Jan. 27, 2022 in U.S. Appl. No. 16/400,320.
U.S. Corrected Notice of Allowance dated May 18, 2018 in U.S. Appl. No. 15/408,291.
U.S. Examiner's Answer to Appeal Brief Before the Patent Trial and Appeal Board on Dec. 27, 2022 in U.S. Appl. No. 16/044,357.
U.S. Examiner's Answer to Appeal Brief Before the Patent Trial and Appeal Board on Dec. 27, 2022 in U.S. Appl. No. 16/044,371.
US Examiner's Answer to the Appeal brief [filed Apr. 28, 2017] before the Patent Trial and Appeal Board dated Sep. 25, 2017 issued in U.S. Appl. No. 13/494,836.
U.S. Examiner's Answer to the Appeal brief [filed May 19, 2017] before the Patent Trial and Appeal Board dated Sep. 22, 2017 issued in U.S. Appl. No. 14/616,435.
U.S. Final office Action dated Nov. 15, 2022 in U.S. Appl. No. 17/658,937.
U.S. Final office Action dated Oct. 25, 2022 in U.S. Appl. No. 17/586,505.
U.S. Final Office Aciton dated Mar. 5, 2019 issued in U.S. Appl. No. 15/169,530.
U.S. Final Office Action dated Apr. 10, 2020 issued in U.S. Appl. No. 15/169,530.
U.S. Final office Action dated Apr. 12, 2022 in U.S. Appl. No. 16/044,371.
U.S. Final Office Action dated Apr. 15, 2022 in U.S. Appl. No. 16/044,357.
U.S. Final Office Action dated Aug. 21, 2014 issued in U.S. Appl. No. 13/494,836.
U.S. Final Office Action dated Aug. 28, 2018 issued in U.S. Appl. No. 14/961,637.
U.S. Final Office Action dated Aug. 6, 2019 issued in U.S. Appl. No. 15/696,045.
U.S. Final Office Action dated Aug. 7, 2020 issued in U.S. Appl. No. 16/194,102.
U.S. Final Office Action dated Dec. 12, 2019 issued in U.S. Appl. No. 16/041,153.
U.S. Final Office Action dated Dec. 23, 2022 in U.S. Appl. No. 17/704,574.
U.S. Final Office Action dated Feb. 22, 2017 issued in U.S. Appl. No. 14/616,435.
U.S. Final office Action dated Jan. 11, 2023 in U.S. Appl. No. 17/586,505.
U.S. Final office Action dated Jan. 12, 2023 in U.S. Appl. No. 17/286,407.
U.S. Final Office Action dated Jul. 11, 2016 issued in U.S. Appl. No. 13/494,836.
U.S. Final Office Action dated Jun. 7, 2021 issued in U.S. Appl. No. 16/044,357.
U.S. Final Office Action dated Mar. 10, 2016 issued in U.S. Appl. No. 14/616,435.
U.S. Final Office Action dated May 14, 2015 issued in U.S. Appl. No. 13/907,699.
U.S. Final Office Action dated May 16, 2018 issued in U.S. Appl. No. 14/692,627.
U.S. Final Office Action, dated May 19, 2017, issued in U.S. Appl. No. 14/692,627.
U.S. Final Office Action dated May 24, 2021 issued in U.S. Appl. No. 16/044,371.
U.S. Final office Action dated Nov. 1, 2022 in U.S. Appl. No. 17/658,935.
U.S. Final Office Action dated Nov. 16, 2015 issued in U.S. Appl. No. 13/494,836.
U.S. Final Office Action dated Nov. 29, 2022 in U.S. Appl. No. 17/704,572.
U.S. Final Office Action dated Nov. 30, 2021 issued in U.S. Appl. No. 16/556,145.
U.S. Final Office Action dated Oct. 20, 2020 issued in U.S. Appl. No. 16/194,102.
U.S. Non Final Office Action dated Aug. 15, 2022 in U.S. Appl. No. 17/704,572.
U.S. Non-Final office Action dated Aug. 29, 2022 in U.S. Appl. No. 17/704,574.
U.S. Non-Final office Action dated Jul. 29, 2022 in U.S. Appl. No. 17/658,937.
U.S. Non-Final office Action dated Nov. 23, 2022 in U.S. Appl. No. 17/704,582.
U.S. Non-Final office Action dated Jul. 22, 2022 in U.S. Appl. No. 17/658,935.
U.S. Non-Final Office Action dated Jun. 21, 2023, in U.S. Appl. No. 17/586,505.
U.S. Notice of Allowance dated Apr. 5, 2023 in U.S. Appl. No. 17/704,574.
U.S. Notice of Allowance dated Aug. 4, 2023, in U.S. Appl. No. 17/286,407.

(56) References Cited

OTHER PUBLICATIONS

U.S. Notice of Allowance dated Aug. 16, 2023 in U.S. Appl. No. 17/286,407.
U.S. Notice of Allowance dated Feb. 10, 2023 in U.S. Appl. No. 17/704,585.
U.S. Notice of Allowance dated Feb. 13, 2023 in U.S. Appl. No. 17/704,572.
U.S. Notice of Allowance dated Feb. 19, 2016 issued in U.S. Appl. No. 14/062,648.
U.S. Notice of Allowance dated Feb. 24, 2021 issued in U.S. Appl. No. 16/194,102.
U.S. Notice of Allowance dated Feb. 4, 2019 issued in U.S. Appl. No. 14/616,435.
U.S. Notice of Allowance dated Feb. 7, 2018 issued in U.S. Appl. No. 15/408,291.
U.S. Notice of Allowance dated Jan. 7, 2019 issued in U.S. Appl. No. 15/283,159.
U.S. Notice of Allowance dated Jul. 24, 2020 issued in U.S. Appl. No. 16/041,153.
U.S. Notice of Allowance dated Jul. 24, 2023 in U.S. Appl. No. 17/704,574.
U.S. Notice of Allowance dated Jul. 8, 2020 issued in U.S. Appl. No. 15/696,045.
U.S. Notice of Allowance dated Jun. 18, 2019 issued in U.S. Appl. No. 14/961,637.
U.S. Notice of Allowance dated Mar. 13, 2023 in U.S. Appl. No. 17/704,582.
U.S. Notice of Allowance dated Mar. 25, 2020 issued in U.S. Appl. No. 16/041,153.
U.S. Notice of Allowance dated Oct. 2, 2023, in U.S. Appl. No. 17/586,505.
U.S. Notice of Allowance dated Oct. 2, 2018 issued in U.S. Appl. No. 13/494,836.
U.S. Notice of Allowance dated Oct. 22, 2019 issued in U.S. Appl. No. 15/972,554.
U.S. Notice of Allowance dated Sep. 10, 2015 issued in U.S. Appl. No. 13/907,699.
U.S. Notice of Allowance dated Sep. 22, 2017 issued in U.S. Appl. No. 15/382,137.
U.S. Office Action dated Apr. 18, 2019 issued in U.S. Appl. No. 15/972,554.
U.S. Office Action dated Apr. 22, 2021 issued in U.S. Appl. No. 16/556,145.
U.S. Office Action dated Aug. 29, 2018 issued in U.S. Appl. No. 15/283,159.
U.S. Office Action dated Dec. 19, 2014 issued in U.S. Appl. No. 13/907,699.
U.S. Office Action dated Dec. 2, 2019 issued in U.S. Appl. No. 15/169,530.
U.S. Office Action dated Dec. 29, 2017 issued in U.S. Appl. No. 15/283,159.
U.S. Office Action dated Feb. 5, 2018 issued in U.S. Appl. No. 14/961,637.
U.S. Office Action dated Feb. 7, 2014 issued in U.S. Appl. No. 13/494,836.
U.S. Office Action dated Jan. 28, 2019 issued in U.S. Appl. No. 15/696,045.
U.S. Office Action dated Jan. 29, 2019 issued in U.S. Appl. No. 14/961,637.
U.S. Office Action dated Jan. 9, 2017 issued in U.S. Appl. No. 13/494,836.
U.S. Office Action dated Jul. 28, 2017 issued in U.S. Appl. No. 15/408,291.
U.S. Office Action dated Jul. 7, 2017 issued in U.S. Appl. No. 15/382,137.
U.S. Office Action dated Jul. 8, 2016 issued in U.S. Appl. No. 14/616,435.
U.S. Office Action dated Jul. 9, 2019 issued in U.S. Appl. No. 16/041,153.
U.S. Office Action dated Mar. 10, 2016 issued in U.S. Appl. No. 13/494,836.
U.S. Office Action dated Mar. 19, 2020 issued in U.S. Appl. No. 16/194,102.
U.S. Office Action dated Mar. 6, 2020 issued in U.S. Appl. No. 15/696,045.
U.S. Office Action dated May 5, 2015 issued in U.S. Appl. No. 13/494,836.
U.S. Office Action dated Nov. 16, 2018 issued in U.S. Appl. No. 15/169,530.
U.S. Office Action dated Nov. 2, 2015 issued in U.S. Appl. No. 14/616,435.
U.S. Office Action dated Nov. 8, 2017 issued in U.S. Appl. No. 14/692,627.
U.S. Office Action dated Sep. 12, 2016 issued in U.S. Appl. No. 14/692,627.
U.S. Office Action dated Sep. 15, 2015 issued in U.S. Appl. No. 14/062,648.
U.S. Office Action dated Sep. 2, 2020 issued in U.S. Appl. No. 16/044,357.
U.S. Office Action dated Sep. 2, 2020 issued in U.S. Appl. No. 16/044,371.
U.S. Office Action dated Sep. 2, 2020 issued in U.S. Appl. No. 16/400,320.
U.S. Restriction Requirement dated Jul. 7, 2022 in U.S. Appl. No. 17/704,585.
U.S. Restriction Requirement dated Apr. 15, 2022, in U.S. Appl. No. 17/586,505.
U.S. Restriction Requirement dated Aug. 26, 2022 in U.S. Appl. No. 17/704,582.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," Appl. Organom et al. Chem., 24:201-207.
Wrobel A.M., et al., "Oligomerization and Polymerization Steps in Remote Plasma Chemical Vapor Deposition of Silicon-Carbon and Silica Films from Organosilicon Sources," Chemistry of Materials, 2001, vol. 13 (5), pp. 1884-1895.
Xu, Ying-Yu, et al., (1999) "Preparation of SiC Thin Film Using Organosilicon by Remote Plasma CVD Method," Mat. Res. Soc. Symp. Proc., 544:185-189.
Declaration Under 37 CFR § 1.132 filed in U.S. Appl. No. 17/286,407 on Jun. 27, 2023.
CN Office Action dated Aug. 13, 2024 in CN Application No. 202110901818.0, with English Translation
CN Office Action dated Jan. 12, 2024 in CN Application No. 201780072499.9, with English Translation.
CN Office Action dated Jun. 17, 2024 in CN Application No. 202110823900.6, with English Translation.
CN Office Action dated May 6, 2024 in CN Application No. 202110901818 with English translation.
CN Office Action dated May 20, 2024 in CN Application No. 201980049654.4 with English translation.
CN Office Action dated Oct. 18, 2024 in CN Application No. 201780072499.9 with English translation.
KR Notice of Allowance dated Nov. 26, 2024 in KR Application No. 10-2021-7005037, with English Translation.
KR Notice of Allowances dated Sep. 23, 2024 in KR Application No. 10-2023- 7032359 with English Translation.
KR Office Action dated May 30, 2022, in Application No. KR10-2022-0042652 with English Translation.
KR Office Action dated Apr. 12, 2022, in Application No. KR1020197019853 with English translation.
KR Office Action dated Apr. 20, 2023, in application No. KR20227018731 with English translation.
KR Office Action dated Aug. 5, 2022 in Application No. KR10-2022-7013124 with English translation.
KR Office Action dated Aug. 5, 2022 in Application No. KR10-2022-7013129 with English translation.
KR Office Action dated Aug. 7, 2024 in KR Application No. 10-2023-0016958 with English translation.
KR Office Action dated Aug. 14, 2024 in KR Application No. 10-2023-0066790, with English Translation.

(56) References Cited

OTHER PUBLICATIONS

KR Office Action dated Feb. 1, 2024 in KR Application No. KR 10-2023-7041846 with English translation.
KR Office Action dated Feb. 19, 2024 in KR Application No. 10-2023-7032359 with English translation.
KR Office Action dated Feb. 23, 2024 in KR Application No. 10-2021-7005037 with English Translation.
KR Office Action dated Jan. 27, 2023, in Application No. KR10-2021-7005461 with English translation.
KR Office Action dated Mar. 7, 2023 in Application No. KR10-2021-7015119 with English translation.
KR Office Action dated Mar. 7, 2023, in Application No. KR10-2022-7013124 with English translation.
KR Office Action dated Mar. 7, 2023, in Application No. KR10-2022-7013129 with English translation
KR Office Action dated Mar. 18, 2024 in KR Application No. 10-2023-0072675, with English Translation
KR Office Action dated May 16, 2023 in Application No. KR10-2021-7005461 with English translation.
TW Office Action dated Jul. 31, 2024 in TW Application No. 113116078, with English Translation.
TW Office Action dated May 7, 2024 in TW Application No. 108125646, with English Translation.
U.S. Non-Final Office Action dated Aug. 16, 2024 in U.S. Appl. No. 18/539,977.
U.S. Notice of Allowance dated Dec. 29, 2023 in U.S. Appl. No. 17/586,505.
U.S. Notice of Allowance dated Nov. 15, 2023, in U.S. Appl. No. 17/286,407.
U.S. Notice of Allowance dated Nov. 29, 2024 in U.S. Appl. No. 18/539,977.
U.S. Notice of Allowance dated Sep. 17, 2024 in U.S. Appl. No. 16/044,371.

DOPED OR UNDOPED SILICON CARBIDE DEPOSITION AND REMOTE HYDROGEN PLASMA EXPOSURE FOR GAPFILL

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Fabrication of devices such as semiconductor devices may involve deposition of various dielectric, conductive, or semiconductive films in recessed features of a substrate. Various techniques for filling such features exist, but as devices shrink and features become smaller, feature fill without voids or seams becomes increasingly challenging.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of depositing a doped or undoped silicon carbide ($SiC_xO_yN_z$) film in one or more features of a substrate. The method includes depositing a first thickness of the $SiC_xO_yN_z$ film in the one or more features of the substrate, exposing the $SiC_xO_yN_z$ film to a remote hydrogen plasma under conditions that increase a size of an opening near a top surface of each of the one or more features, and depositing a second thickness of the $SiC_xO_yN_z$ film on the first thickness of the $SiC_xO_yN_z$ film, where x has a value greater than zero, y has a value equal to or greater than zero, and z has a value equal to or greater than zero.

In some implementations, the method further includes repeating operations of exposing the $SiC_xO_yN_z$ film to the remote hydrogen plasma and depositing a new thickness of the $SiC_xO_yN_z$ film in the one or more features until the one or more features are substantially filled. In some implementations, the conditions of the remote hydrogen plasma include a treatment time, a treatment frequency, a treatment power, and/or remote plasma gas composition, where the treatment time, the treatment frequency, the treatment power, and/or the remote plasma gas composition are controlled so that the size of the opening near the top surface of each of the one or more features is increased more than a size of an opening near a bottom surface of each of the one or more features. The treatment time of exposure to the remote hydrogen plasma may be between about 0.5 seconds and about 120 seconds. The treatment frequency may be 10 Å or less of the $SiC_xO_yN_z$ film per cycle of depositing the $SiC_xO_yN_z$ film and exposing the $SiC_xO_yN_z$ film to remote hydrogen plasma. The remote plasma gas composition of the remote hydrogen plasma may include the remote hydrogen plasma having a concentration between about 10% and about 50% by volume of hydrogen. In some implementations, each of the first thickness and the second thickness is between about 0.5 Å and about 4.5 Å. In some implementations, depositing the first thickness of the $SiC_xO_yN_z$ film includes flowing one or more silicon-containing precursors into a reaction chamber, and introducing one or more hydrogen radicals generated from a remote plasma source and towards the substrate in the reaction chamber, where the one or more hydrogen radicals react with the one or more silicon-containing precursors to deposit the first thickness of the $SiC_xO_yN_z$ film. In some implementations, at least 90% of the hydrogen radicals are hydrogen radicals in the ground state. In some implementations, the conditions of the remote hydrogen plasma increase the size of the opening near the top surface of each of the one or more features by at least about 5%. In some implementations, the conditions of the remote hydrogen plasma increase the size of the opening near the top surface of each of the one or more features when an atomic concentration of carbon of the first thickness of the $SiC_xO_yN_z$ film is between about 10% and about 30%. In some implementations, operations of depositing the first thickness of the $SiC_xO_yN_z$ film and exposing the $SiC_xO_yN_z$ film to the remote hydrogen plasma occur without introducing a vacuum break. In some implementations, the method further includes introducing a time interval between depositing the first thickness of the $SiC_xO_yN_z$ film and exposing the first thickness of the $SiC_xO_yN_z$ film to remote hydrogen plasma in order to modulate gapfill performance.

Another aspect involves an apparatus. The apparatus includes a reaction chamber, a substrate support for supporting a substrate in the reaction chamber, the substrate having one or more features, and a controller. The controller is configured with instructions for performing the following operations: depositing a first thickness of a doped or undoped silicon carbide ($SiC_xO_yN_z$) film in the one or more features of the substrate, exposing the $SiC_xO_yN_z$ film to a remote hydrogen plasma under conditions that increase a size of an opening near a top surface of each of the one or more features, depositing a second thickness of the $SiC_xO_yN_z$ film on the first thickness of the $SiC_xO_yN_z$ film, where x has a value greater than zero, y has a value equal to or greater than zero, and z has a value equal to or greater than zero.

In some implementations, the controller is further configured with instructions for performing the following operation: repeating operations of exposing the $SiC_xO_yN_z$ film to the remote hydrogen plasma and depositing a new thickness of the $SiC_xO_yN_z$ film in the one or more features until the one or more features are substantially filled. In some implementations, the conditions of the remote hydrogen plasma include a treatment time, a treatment frequency, a treatment power, and/or a remote plasma gas composition, where the treatment time, the treatment frequency, the treatment power, and/or remote plasma gas composition are controlled so that the size of the opening near the top surface of each of the one or more features is increased more than a size of an opening near a bottom surface of each of the one or more features. The remote plasma gas composition of the remote hydrogen plasma may include the remote hydrogen plasma having a concentration between about 10% and about 50% by volume of hydrogen. In some implementations, each of the first thickness and the second thickness is equal to or less than about 10 Å. In some implementations, the controller is further configured with instructions for performing the following operation: introducing a time interval between depositing the first thickness of the $SiC_xO_yN_z$ film and exposing the first thickness of the $SiC_xO_yN_z$ film to remote hydrogen plasma in order to modulate gapfill performance.

These and other aspects are described further below with reference to the drawings.

DETAILED DESCRIPTION

Figure 1:
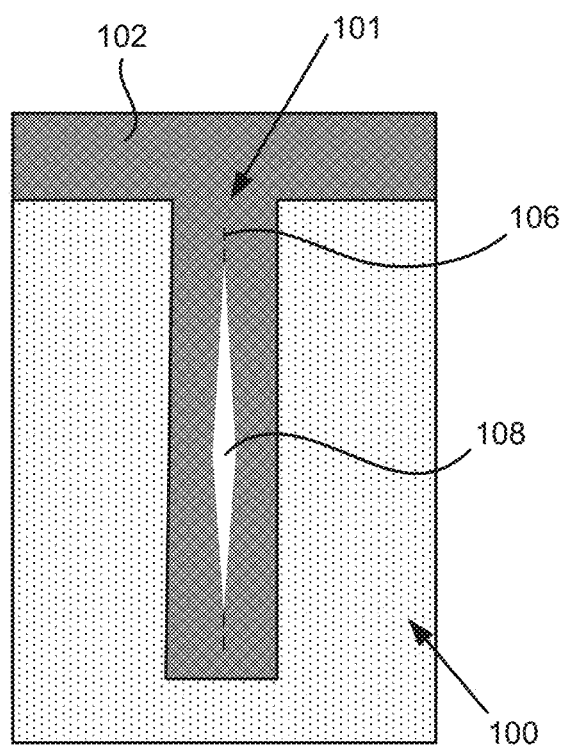
FIG. 1 illustrates a cross-sectional schematic of an example feature of a substrate.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Substrates may include "features" or "trenches." "Features" as used herein may refer to non-planar structures of a substrate, typically a surface being modified in a semiconductor device fabrication operation. Examples of features, which may also be referred to as "negative features" or "recessed features," include trenches, holes, vias, gaps, recessed regions, and the like. These terms may be used interchangeably in the present disclosure. One example of a feature is a hole or via in a semiconductor substrate or in a layer on the substrate. Another example is a trench in a substrate or layer. A feature typically has an aspect ratio (depth to lateral dimension). A feature may be characterized by one or more of narrow and/or re-entrant openings, constrictions within the feature, and high aspect ratios. A feature having a high aspect ratio can have a depth to lateral dimension aspect ratio equal to or greater than about 10:1, equal to or greater than about 15:1, equal to or greater than about 20:1, equal to or greater than about 25:1, equal to or greater than about 30:1, equal to or greater than about 40:1, equal to or greater than about 50:1, or equal to or greater than about 100:1. In various embodiments, the feature may have an under-layer, such as a barrier layer or adhesion layer. Non-limiting examples of under-layers include dielectric layers and conducting layers, e.g., silicon oxides, silicon nitrides, undoped silicon carbides, oxygen-doped silicon carbides, nitrogen-doped silicon carbides, metal oxides, metal nitrides, metal carbides, and metal layers.

Features of a substrate can be of various types. In some embodiments, a feature can have straight sidewalls, positively sloped sidewalls, or negatively sloped sidewalls. In some embodiments, a feature can have sidewall topography or sidewall roughness, which may occur as a result of an etch process to form the feature. In some embodiments, a feature can have a feature opening that is greater at the top of the feature than at the bottom, or a feature can have a feature opening that is greater at the bottom of the feature than at the top. In some embodiments, a feature can be partially filled with material or have one or more under-layers. Gapfill of features such as any of foregoing embodiments can depend on feature type and profile. Semiconductor fabrication processes often include gapfill processes or dielectric gapfill processes. Typically, chemical vapor deposition (CVD) and/or atomic layer deposition (ALD) methods are used to fill features. Conventional techniques, however, often result in formation of undesirable seams or voids within the feature. In some embodiments, the presence of seams and/or voids in gapfill may lead to high resistance, contamination, loss of filled materials, degraded performance, and even device failure.

As the aspect ratio of features increases, mass transport limitations of CVD gas phase reactions may cause "breadloafing" deposition effects that show thicker deposition at top surfaces and thinner deposition at recessed surfaces, which causes the top of a feature opening to close before the feature can be completely filled. Unlike CVD processes, ALD processes use surface-mediated deposition reactions to deposit films on a layer-by-layer basis, and such films are typically conformal. Although ALD can deposit highly conformal films, deposition of films into high aspect ratio features can be challenging. The step coverage and uniformity of film along the sidewall depends on, for example, transport of the deposition precursor, reactant ions and/or radicals, and byproducts. As the lateral dimension of the feature is reduced or the depth of the feature is increased, transport and diffusion of the deposition precursor and/or reactant species becomes increasingly difficult in the feature. Thus, the top of the feature is exposed to more precursor and reactant species and the bottom of the feature is exposed to fewer precursor and reactant species due to diffusion limitations. This can lead to the formation of seams and/or voids in high aspect ratio features.

FIG. 1 illustrates a cross-sectional schematic of an example feature of a substrate. A substrate 100 has a feature 101 that is filled using a conventional CVD, plasma-enhanced CVD (PECVD), ALD, or plasma-enhanced ALD (PEALD) technique. A seam 106 forms where gapfill material 102 deposited along sidewalls of the feature 101 meets. If ALD or PEALD techniques are used, the opening at the top of the feature 101 closes and molecular transport becomes progressively difficult, which causes the seam 106 to form near the top of the feature 101 and leave a void 108 in the feature 101. If CVD or PECVD techniques are used, the gapfill material 102 will tend to build up faster at the edges of the feature 101 than along sidewalls of the feature so that the top of the feature 101 closes off and is "pinched"

at the seam 106 before the feature 101 is filled, thereby leaving a void 108 in the feature 101.

In addition to the formation of voids and seams, the film deposited within the feature may have a different and more degraded film quality than the film deposited near the top of the feature. Without being limited by any theory, this may be because the number and distribution of reactant species reaching the bottom of the feature is different from and less than at the top. In some embodiments, film quality can be evaluated by etching the deposited film and observing and comparing the etch rates at the top of the feature, at the bottom of the feature, and at the sidewalls of the feature.

To improve gapfill performance in CVD, PECVD, ALD, or PEALD processes, one of many approaches are generally implemented.

In some embodiments, the deposition rate for CVD, PECVD, ALD, or PEALD gapfill can be slowed down. Slowing down deposition rate can fine tune the deposition profile in the gapfill structure and improve gapfill performance. For example, more cycles can be performed in ALD or PEALD processes before a feature is closed off. In addition or in the alternative, a longer duration during initial cycles may allow diffusion of precursor and/or reactant species to reach the bottom and sidewalls of the features. However, slowing down the deposition rate to improve gapfill decreases overall throughput and generally is more applicable to low aspect ratio features and/or features with large openings.

Figure 2:
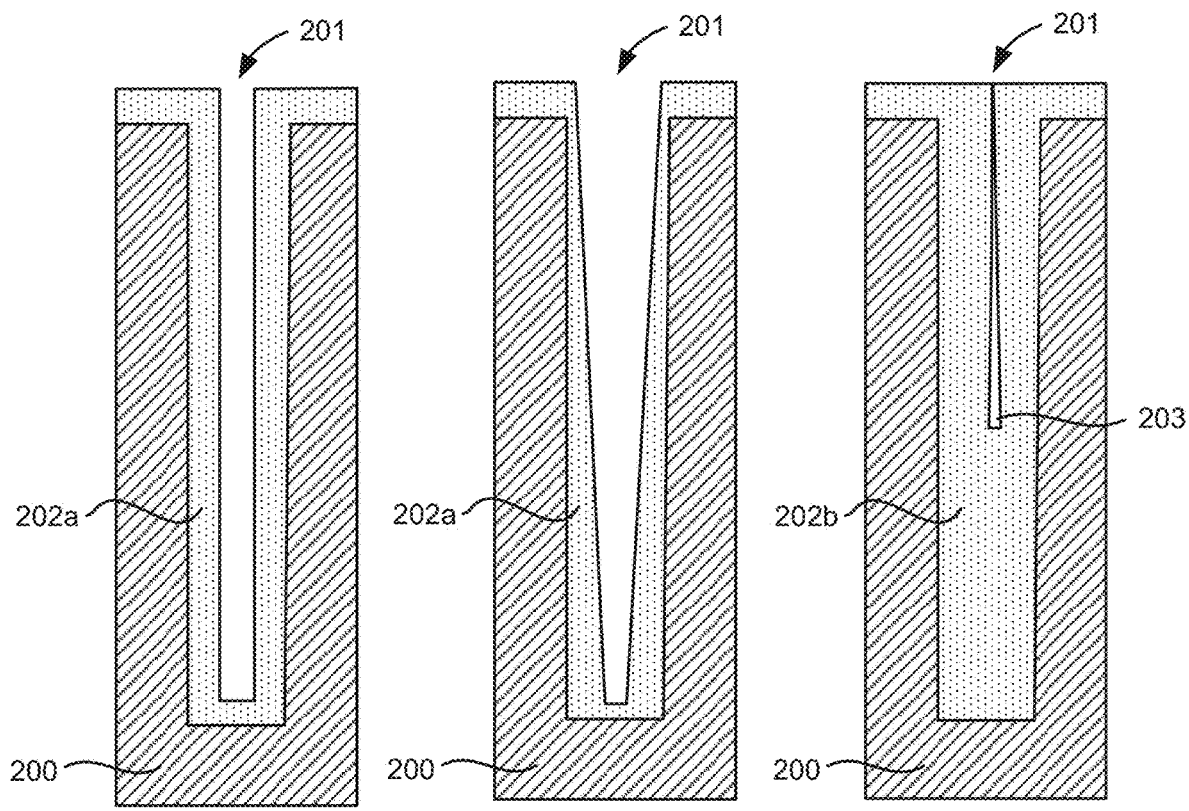
FIGS. 2A-2C are cross-sectional schematic illustrations of a feature of an example substrate undergoing gapfill using dep-etch-dep processing.

In some embodiments, dep-etch-dep (deposition, etch, deposition) techniques are employed to fill features. The dep-etch-dep technique involves deposition of gapfill material, followed by etching some of the gapfill material back to open the feature opening, and followed by re-depositing some of the same gapfill material to complete the gapfill or advance the gapfill process. FIGS. 2A-2C are cross-sectional schematic illustrations of a feature of an example substrate undergoing gapfill using dep-etch-dep processing. FIG. 2A shows an example of a feature 201 of a substrate 200 where material 202a is deposited in the feature 201. The material 202a may be deposited conformally along a top surface, sidewalls, and a bottom surface of the feature 201. In some embodiments, the material 202a may be deposited using ALD or PEALD. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted reactant material or reaction byproducts from the chamber. The dose step may adsorb precursor material in a self-limiting manner such that once active sites are occupied by the precursor material, little or no additional precursor material will be adsorbed on the substrate surface. The reactant material may likewise react with the precursor material in a self-limiting or adsorption-limiting manner. Purge steps may be optionally performed to remove excess precursor material, reaction byproducts, and/or unreacted reactant material from the chamber, thereby completing an ALD cycle. FIG. 2B shows an example of the feature 201 of the substrate 200 where the material 202a is etched back. For example, as shown in FIG. 2B, the material 202a can be etched back and result in a tapered profile. Thus, more of the material 202a is removed near the top of the feature 201 than at the bottom of the feature 201. The etch operation performed in FIG. 2B reshapes the deposited material 202a so that more material can be filled in the feature 201. When a subsequent deposition operation is performed that deposits more material near the top of the feature 201 than at the bottom of the feature 201, the feature 201 can be filled with smaller or no voids. FIG. 2C shows an example of the feature 201 of the substrate 200 where material 202b is deposited in the feature 201. The material 202b includes the material 202a from FIGS. 2A and 2B. As shown in FIG. 2C, the material 202b may substantially fill the feature 201 following deposition and etch operations. Deposition of the material 202b may result in formation of a void 203, but the void 203 may be smaller by interrupting deposition operations with one or more etch operations. While dep-etch-dep techniques may mitigate the formation of voids and/or seams, etch operations during dep-etch-dep may etch underlying materials, which often leads to device instability and possible device failure. Furthermore, dep-etch-dep techniques often involve multiple rounds of dep-etch-dep and/or multiple wafer transfers between deposition and etch chambers, which lowers overall throughput.

Figure 3:
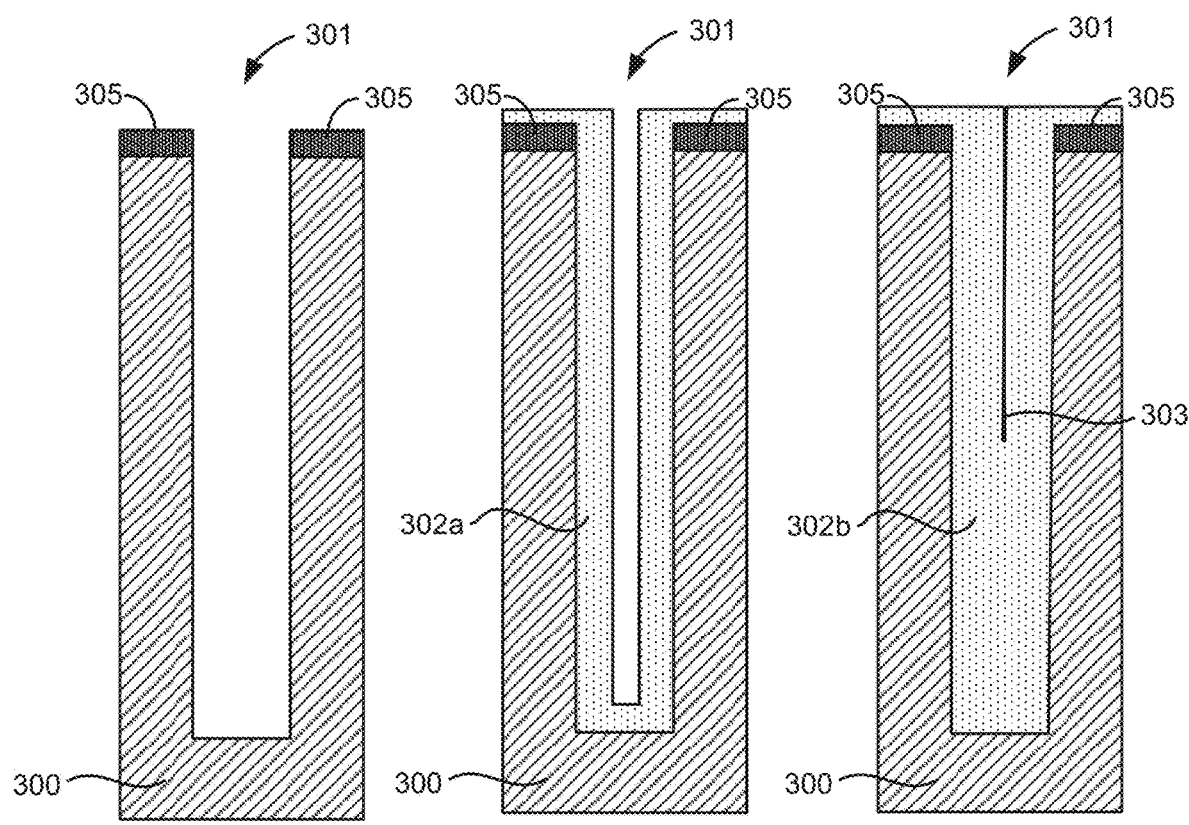
FIGS. 3A-3C are cross-sectional schematic illustrations of a feature of an example substrate undergoing gapfill using inhibition chemistry.

In some embodiments, inhibition chemistry can be used so that gapfill material grows or otherwise forms in the feature in a topographically different manner. For example, an inhibitor can react with a material and create a passivated surface to inhibit growth. A surface of a substrate can be more passivated in field and upper regions of a feature and less passivated as a distance into the feature increases. That way, deposition at the top of a feature is selectively inhibited and deposition in lower portions of the feature can proceed with less inhibition or without being inhibited. As a result, bottom-up fill is enhanced. FIGS. 3A-3C are cross-sectional schematic illustrations of a feature of an example substrate undergoing gapfill using inhibition chemistry. FIG. 3A shows an example of a feature 301 of a substrate 300 where at least a field region and upper regions of the feature 301 are exposed to a reactant that inhibits deposition/growth of gapfill material. The reactant reacts with a material to form a passivated layer 305 on the substrate 300. By way of an example, nitrogen gas ($N_2$) or ammonia ($NH_3$) may be used to form the passivated layer 305 that is made of a nitride. Gapfill material, such as ALD silicon dioxide ($SiO_2$), nucleates at a slower rate on nitride surfaces. In FIG. 3B, gapfill material 302a is deposited in the feature 301. The gapfill material 302a may be deposited along a top surface, sidewalls, and a bottom surface of the feature 301. The passivated layer 305 selectively inhibits deposition/growth of the gapfill material 302a in the field region and upper regions of the feature 301 so that deposition/growth of the gapfill material 302a in other regions of the feature 301 proceeds with less inhibition or without inhibition. In FIG. 3C, gapfill material 302b is deposited to substantially fill the feature 301. Deposition of the gapfill material 302b may result in the formation of a void 303, but the void 303 may be smaller by virtue of the inhibition chemistry promoting bottom-up filling in the feature 301. While inhibition chemistry may mitigate the formation of voids and/or seams, inhibition chemistries are limited to certain types of chemistries and processes. In other words, different processes require different inhibition chemistries. Certain inhibition chemistries may not be suitable for limiting deposition/growth of $SiC_xO_yN_z$ films, or deposition/growth of $SiC_xO_yN_z$ films using a particular deposition technique (e.g., remote plasma CVD), or deposition/growth of $SiC_xO_yN_z$ films with desired properties (e.g., high etch selectivity to oxide and nitride). Thus, application of inhibition chemistry in gapfill may be limited to certain chemistries, deposition techniques, and film properties.

The present disclosure relates to deposition of doped or undoped silicon carbide film for gapfill using remote plasma CVD and remote plasma exposure. One or more high aspect ratio features are filled or at least substantially filled with doped or undoped silicon carbide gapfill material. In some embodiments, the doped or undoped silicon carbide gapfill material is silicon oxycarbide (SiCO). In some embodiments, the doped or undoped silicon carbide gapfill material is silicon nitricarbide (SiCN). A source gas including hydrogen gas is provided into a remote plasma source that may cause the source gas to dissociate and generate ions and radicals in an excited energy state. After excitation, the radicals in the excited energy state relax to substantially low energy state radicals or ground state radicals in a reaction chamber. One or more silicon-containing precursors are provided in the reaction chamber, where bonds in the one or more silicon-containing precursors are selectively broken by the substantially low energy state radicals or ground state radicals to form the doped or undoped silicon carbide gapfill material in the one or more high aspect ratio features. Gapfill occurs by alternating deposition and treatment operations, where the deposition operation includes depositing a certain thickness of doped or undoped silicon carbide gapfill material by remote plasma CVD and where the treatment operation includes exposing the doped or undoped silicon carbide gapfill material to remote hydrogen plasma. Remote hydrogen plasma treatment conditions are controlled so that a size of an opening near a top surface of each of the high aspect ratio features is increased after treatment. In some instances, the size of the opening near the top surface is increased more than a size of an opening near a bottom surface of each of the high aspect ratio features after treatment. In some embodiments, the remote hydrogen plasma treatment conditions are controlled by controlling treatment time, treatment frequency, treatment power, and/or remote plasma gas composition. Various time intervals can be introduced in between plasma deposition and plasma treatment to modulate the gapfill performance.

Silicon carbide films are frequently used in semiconductor devices. As used herein, the term "silicon carbide" includes undoped or doped silicon carbides, such oxygen doped silicon carbide or silicon oxycarbide (SiCO), nitrogen doped silicon carbide or silicon nitricarbide (SiCN), and nitrogen and oxygen doped silicon carbide or silicon oxynitricarbide (SiOCN). For many, doped silicon carbides have at most about 50% atomic of dopant atoms, whether those atoms are oxygen, nitrogen, or atoms of another element. The doping level provides desired film properties. As used herein, reference to "doped or undoped silicon carbide" refers specifically to "$SiC_xO_yN_z$," where x has a value greater than zero, y has a value equal to or greater than zero, and z has a value equal to or greater than zero.

Doped or undoped silicon carbide films may be employed as metal diffusion barriers, etch stop layers, hard mask layers, gate spacers for source and drain implants, encapsulation barriers for magnetoresistive random-access memory (MRAM) or resistive random-access memory (RRAM), and hermetic diffusion barriers at air gaps, among other applications. In some embodiments, doped or undoped silicon carbide films may be used as gapfill material in high aspect ratio features of transistor devices.

Figure 4:
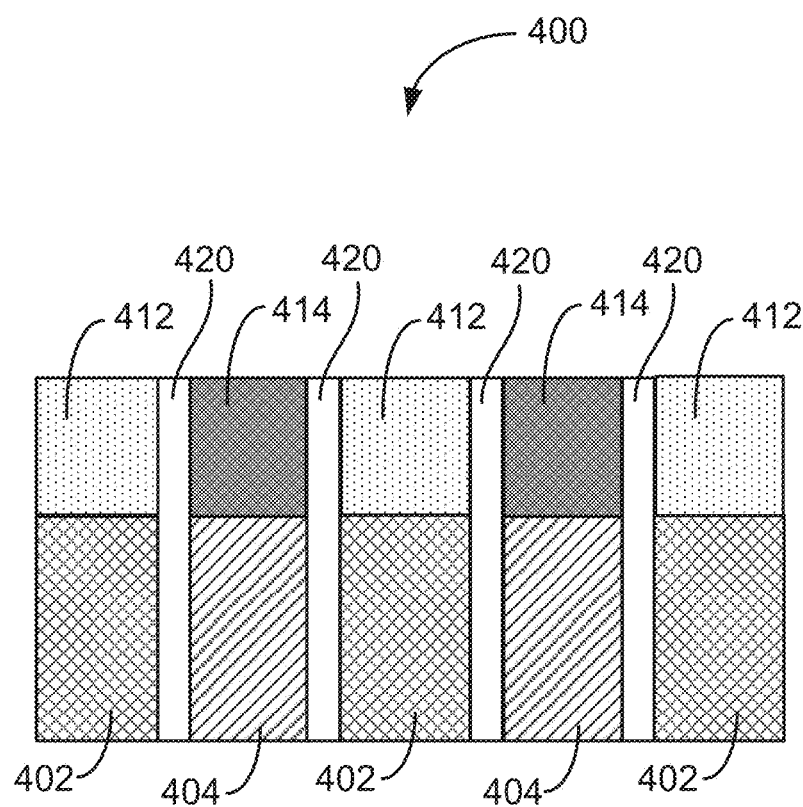
FIG. 4 illustrates a cross-sectional schematic of different gapfill materials in an example substrate according to some implementations.

FIG. 4 illustrates a cross-sectional schematic of different gapfill materials in an example substrate according to some implementations. A semiconductor device 400 may include first electrically conductive structures 402 and second electrically conductive structures 404. In some embodiments, the semiconductor device 400 is a transistor device. Spacers 420 may separate the first electrically conductive structures 402 and the second electrically conductive structures 404. A first gapfill material forms a first insulating cap layer 412 over the first electrically conductive structures 402, and a second gapfill material forms a second insulating cap layer 414 over the second electrically conductive structures 404. The first insulating cap layer 412 may have a different etch selectivity than the second insulating cap layer. For example, the first gapfill material of the first insulating cap layer 412 may have an etch selectivity of at least 7:1 under dry etch or wet etch conditions against the second gapfill material of the second insulating cap layer 414. The first gapfill material may have excellent electrical properties including high breakdown voltages and low leakage currents. Moreover, the first gapfill material may have a low dielectric constant (low-k), where the effective dielectric constant of the first gapfill material is about 4.0 or lower, about 3.5 or lower, about 3.0 or lower, or about 2.5 or lower. In some embodiments, the first gapfill material is SiCO formed by a remote plasma CVD process of the present disclosure. The second gapfill material may be a nitride or oxide, such as silicon nitride or silicon oxide. In some embodiments, the first electrically conductive structures 402 include source/drain contacts in a transistor device, and the second electrically conductive structures 404 include a gate stack having a gate electrode layer and a gate dielectric layer in the transistor device. Having the first gapfill material be SiCO formed by the remote plasma CVD process of present disclosure not only provides good electrical properties, low dielectric constant, and high etch selectivity against other gapfill materials, but also provides good step coverage and gapfill performance that does not leave a significant seam and/or void.

Features of a substrate may be filled or at least substantially filled with doped or undoped silicon carbide gapfill material using a process that involves alternating operations of remote plasma CVD and remote hydrogen plasma exposure. In other words, a certain thickness of doped or undoped silicon carbide gapfill material may be deposited by remote plasma CVD followed by a controlled remote hydrogen plasma exposure, and the steps may be repeated until the features are filled or at least substantially filled. As used herein, substantially filled may refer to having the feature filled to at least 98% by volume.

Figures 5A, 5B, 5C:
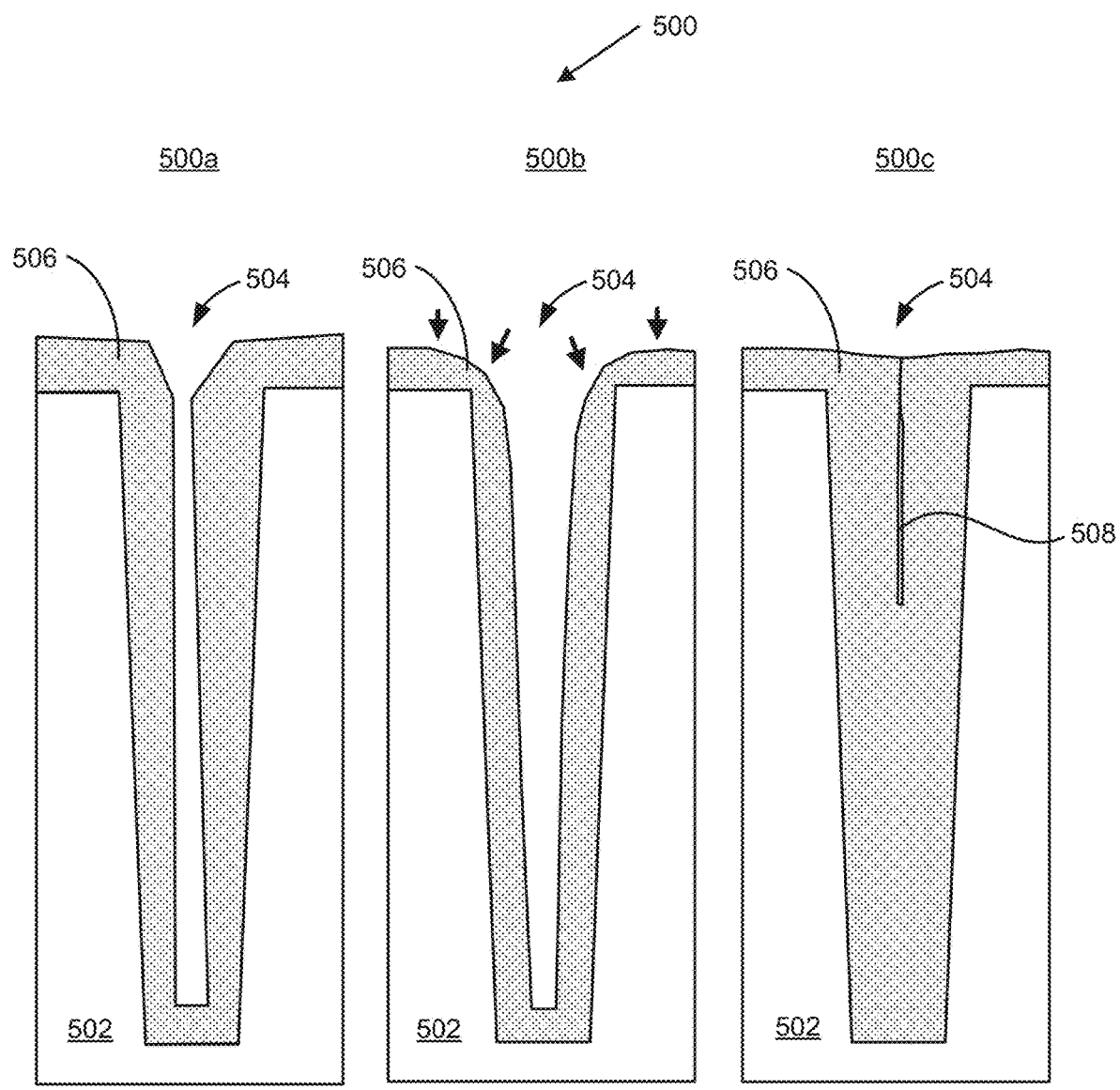
FIGS. 5A-5C are cross-sectional schematic illustrations of a feature of an example substrate undergoing gapfill using remote plasma chemical vapor deposition and remote hydrogen plasma exposure operations according to some implementations.

FIG. 5A-5C are cross-sectional schematic illustrations of a feature of an example substrate undergoing gapfill using remote plasma chemical vapor deposition and remote hydrogen plasma exposure operations according to some implementations. Operations 500a-500c of a process 500 shown in FIGS. 5A-5C may include additional, fewer, or different operations. The operations 500a-500c of the process 500 shown in FIGS. 5A-5C may be performed by any one of the plasma processing apparatuses as described in FIGS. 6 and 7.

At operation 500a of the process 500, a first thickness of a $SiC_xO_yN_z$ film 506 is deposited in a feature 504 of a substrate 502. Though the substrate 502 shows only a single feature 504 in FIGS. 5A-5C, it will be understood that the substrate 502 may have one or more features 504. In some embodiments, the $SiC_xO_yN_z$ film 506 includes silicon oxycarbide (SiCO). The first thickness of the $SiC_xO_yN_z$ film 506 is deposited by a remote plasma CVD process. The remote plasma CVD process deposits the first thickness of the $SiC_xO_yN_z$ film 506 on the surface of the substrate 502 under relatively mild conditions adjacent to the substrate 502.

Depositing the first thickness of the $SiC_xO_yN_z$ film 506 includes flowing one or more silicon-containing precursors into a reaction chamber and introducing one or more hydrogen radicals generated from a remote plasma source towards the substrate 502 in the reaction chamber, where the one or more hydrogen radicals react with the one or more silicon-containing precursors to deposit the first thickness of the $SiC_xO_yN_z$ film 506. The one or more silicon-containing precursors can include a silicon-containing precursor with one or more silicon-hydrogen (Si—H) bonds and/or silicon-silicon (Si—Si) bonds. In some embodiments, the silicon-containing precursor can have one or more silicon-carbon (Si—C) bonds. In some embodiments, the silicon-containing precursor can have one or more silicon-oxygen (Si—O) bonds. In some embodiments, the silicon-containing precursor can have one or more silicon-nitrogen (Si—N) bonds. Examples of silicon-containing precursors are discussed in further detail below.

During the deposition process, the Si—H bonds and/or Si—Si bonds are broken and serve as reactive sites for forming bonds between the silicon-containing precursors in the deposited $SiC_xO_yN_z$ film 506. The broken bonds can also serve as sites for cross-linking during thermal processing conducted during or after deposition. Bonding at the reactive sites and cross-linking can form a primary backbone or matrix collectively in the resulting $SiC_xO_yN_z$ film 506. In some embodiments, the relatively mild conditions can preserve or substantially preserve Si—C bonds and, if present, Si—O bonds and Si—N bonds in the as-deposited layer of the $SiC_xO_yN_z$ film 506.

Accordingly, the reaction conditions adjacent to the substrate 502 provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, introduction of a co-reactant such as oxygen may extract carbon from Si—C bonds. Generally, the described reaction conditions exist at the exposed face of the substrate 502 (the face where the $SiC_xO_yN_z$ film 506 is deposited). They may further exist at some distance above the substrate 502, e.g., about 0.5 micrometers to about 150 millimeters above the substrate 502. In effect, activation of the silicon-containing precursors can happen in the gas phase at a substantial distance above the substrate 502. Typically, the pertinent reaction conditions will be uniform or substantially uniform over the entire exposed face of the substrate 502, although certain applications may permit some variation.

In addition to the silicon-containing precursors, the environment adjacent to the substrate 502 includes one or more radicals that are in a substantially low energy state or ground state. The one or more radicals can include one or more hydrogen radicals, which may also be referred to as hydrogen atom radicals or hydrogen radical species. In some embodiments, all, or substantially all, or a substantial fraction of the hydrogen radicals adjacent to the substrate 502 are in the ground state, e.g., at least about 90% or 95% of the hydrogen radicals adjacent to the substrate 502 are in the ground state. As an example, hydrogen gas ($H_2$) may be provided in an inert carrier gas such as helium in a remote plasma source. Hydrogen radicals are generated in the remote plasma source and introduced into the reaction chamber. Once generated in the remote plasma source, the hydrogen radicals are in an excited energy state. For example, hydrogen in an excited energy state can have an energy of at least 10.2 eV (first excited state). Excited hydrogen radicals may cause unselective decomposition of a silicon-containing precursor, easily breaking Si—H, Si—Si, Si—N, Si—O, and Si—C bonds, which can alter the composition or physical or electrical characteristics of the $SiC_xO_yN_z$ film 506. This can lead to films with high dielectric constants, low breakdown voltages, high leakage currents, and poor conformality. Process conditions are controlled so that the hydrogen radicals lose their energy or relax when they encounter the substrate 502 without recombining. The process conditions are controlled so that the hydrogen radicals are in a substantially low energy state or ground state at the environment adjacent to the substrate 502, where hydrogen radicals in a substantially low energy state or ground state can be capable of selectively breaking Si—H and Si—Si bonds while generally preserving Si—O, Si—N, and Si—C bonds. For example, the plasma processing apparatus or associated components may be designed so that a residence time of hydrogen radicals diffusing from the remote plasma source to the substrate 502 is greater than the energetic relaxation time of an excited hydrogen atom radical. The plasma processing apparatuses shown in FIGS. 6 and 7 may be configured to produce a mild state in which a substantial fraction of the hydrogen radicals in the environment adjacent to the substrate 502 are in a ground state.

The source gas for the hydrogen radicals may be delivered with other species, including carrier gas. The silicon-containing precursors may be delivered with other species, including carrier gas. Example carrier gases include but are not limited to argon (Ar), helium (He), neon (Ne), krypton (Kr), and xenon (Xe). The concentration of carrier gas can be substantially greater than the concentration of the source gas. As used herein, "substantially greater" with respect to the concentration of carrier gas relative to source gas can refer to a percentage by volume that is at least three times greater. By way of an example, hydrogen gas may be provided in a helium carrier gas at a concentration of about 1-50% hydrogen. The presence of the carrier gas can contribute to increased ionization of the source gas and reduced recombination. Though lower pressure typically facilitates increased ionization of the source gas and reduced recombination, the presence of the carrier gas can serve the same effect. That way, even at a higher pressure, a substantial fraction of radicals may be generated with minimal recombination when a carrier gas such as helium is flowed with the source gas. Higher pressure in the reaction chamber during deposition may improve the conformality of the $SiC_xO_yN_z$ film 506. Higher pressure in the reaction chamber may correspond to a pressure greater than about 3 Torr or greater than about 5 Torr, such as about 7 Torr.

In some embodiments, the silicon-containing precursors are introduced as a mixture having major and minor species. The minor species may not contribute significantly to the composition or structural features of the $SiC_xO_yN_z$ film 506. In some embodiments, the silicon-containing precursors provide essentially all of the mass of the deposited $SiC_xO_yN_z$ film 506, with small amounts of hydrogen or other element from the remote plasma providing less than about 5 atomic percent or less than about 2 atomic percent. In some embodiments, the deposition reaction includes a co-reactant other than the silicon-containing precursors and the hydrogen radicals, which may or may not contribute to the composition of the deposited $SiC_xO_yN_z$ film 506. Thus, the co-reactant may tune the composition of the first thickness of the $SiC_xO_yN_z$ film 506. Examples of co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), and combinations thereof. Such materials may be used as nitriding agents, oxidizers, reductants, etc. Depending on the choice of the co-reactant, the co-reactant may increase or decrease the carbon, oxygen, or nitrogen content of the $SiC_xO_yN_z$ film 506. In some embodiments, the co-reactant may be introduced into the reaction chamber along the same flow path as the hydrogen radicals. The co-reactant may be introduced upstream of the silicon-containing precursors, where the co-reactant may be at least partially converted to radicals and/or ions. In some embodiments, the co-reactant may be introduced into the reaction chamber along the same flow path as the silicon-containing precursors. In such instances, the co-reactant may be introduced downstream of the hydrogen radicals, typically without direct exposure to plasma. In some embodiments, the co-reactant may be present in the process gases at about 0.05% or less by mass, or at about 0.01% or less by mass, or at about 0.001% or less by mass. In some embodiments, the co-reactant may be present at higher concentrations, such as about 2% or less or about 0.1% or less by mass. In some embodiments, the co-reactant is present at even higher concentrations, such as about 10% or more or about 20% or more by mass. In some embodiments, bonds in a co-reactant may be selectively broken by the hydrogen radicals to activate the co-reactant.

Process conditions for depositing the first thickness of the $SiC_xO_yN_z$ film 506 can be controlled. In some embodiments, a temperature in the environment adjacent to the substrate 502 can be largely controlled by the temperature of a pedestal on which the substrate 502 is supported during deposition of the $SiC_xO_yN_z$ film 506. In some embodiments, the operating temperature can be between about 50° C. and about 500° C. or between about 250° C. and about 400° C. Increasing temperature can lead to increased cross-linking on the substrate surface. In some embodiments, a pressure in the reaction chamber can be controlled to facilitate production of reactive radicals. In some embodiments, chamber pressure can be about 35 Torr or lower, between about 10 Torr and about 20 Torr in some applications, or between about 0.2 Torr and about 5 Torr in some other applications.

The silicon-containing precursors used in forming the $SiC_xO_yN_z$ film 506 may each contain at least one Si—H and/or at least one Si—Si bond. The silicon-containing precursors may optionally each contain at least one Si—O bond, Si—N bond, and/or Si—C bond. In some embodiments, the silicon-containing precursors each do not contain O—C or N—C bonds; e.g., the precursors contain no alkoxy (—O—R), where R is an organic group such as a hydrocarbon group, or amine (—NR$_1$R$_2$), where R$_1$ and R$_2$ are independently hydrogen or organic groups. Without being limited by any theory, it is believed that such groups may impart high sticking coefficients to the precursors or fragments on which they reside.

The silicon-containing precursors employed in the deposition reaction may be limited to a particular chemical class or mixtures of the chemical classes. In some embodiments, the silicon-containing precursors include siloxanes. The siloxanes may be cyclic, three-dimensional or caged, or linear. In some embodiments, the silicon-containing precursors include alkyl silanes or other hydrocarbon-substituted silanes. For example, the silicon-containing precursor can include an alkylcarbosilane. In some embodiments, the silicon-containing precursors include alkoxy silanes. In some embodiments, the silicon-containing precursors include silazanes. The silazanes may be cyclic or linear. Specific examples of the chemical classes of silicon-containing precursors are described in U.S. patent application Ser. No. 14/616,435 to Varadarajan et al., filed Feb. 6, 2015, titled "CONFORMAL DEPOSITION OF SILICON CARBIDE FILMS," which is incorporated herein by reference in its entirety and for all purposes.

In depositing the $SiC_xO_yN_z$ film 506, multiple silicon-containing precursors can be present in the process gas, where some of the silicon-containing precursors are different. For example, a siloxane and an alkyl silane can be used together, or a siloxane and an alkoxy silane can be used together. The relative proportions of the individual precursors can be chosen based on the chemical structures of the precursors chosen and the application of the resulting $SiC_xO_yN_z$ film 506. For example, an amount of siloxane can be greater than an amount of silane in molar percentages to produce a more porous film.

In some embodiments when depositing silicon oxycarbide films, the silicon-containing precursors may include siloxanes such as cyclic siloxanes or linear siloxanes. In some embodiments when depositing silicon oxycarbide films, the silicon-containing precursors may include alkyl silanes. An oxygen-containing co-reactant may be introduced to react with the alkyl silanes.

The silicon-containing precursors may be chosen to produce a highly conformal $SiC_xO_yN_z$ film 506. Conformality may be calculated by comparing the average thickness of a deposited film on a bottom, sidewall, or top of a feature 504 to the average thickness of a deposited film on a bottom, sidewall, or top of a feature 504. For example, conformality may be calculated by dividing the average thickness of the deposited film on the sidewall by the average thickness of the deposited film at the top of the feature 504 and multiplying it by 100 to obtain a percentage. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species.

At operation 500a of the process 500, the first thickness of the $SiC_xO_yN_z$ film 506 may have a conformality of at least about 75%, at least about 80%, at least about 85%, at least about 90%, at least about 95%, or at least about 98%. The first thickness of the $SiC_xO_yN_z$ film 506 may be equal to or less than about 10 Å, or may be equal to or less than about 5 Å. In some embodiments, the first thickness of the $SiC_xO_yN_z$ film 506 may be between about 0.5 Å and about 5 Å, or between about 0.5 Å and about 4.5 Å.

The first thickness of the $SiC_xO_yN_z$ film 506 can be deposited according to a predetermined deposition time to achieve a desired thickness. In some embodiments, the deposition time can be between about 1 second and about 200 seconds, or between about 5 seconds and about 100 seconds. The first thickness can be controlled to enable sufficient penetration of a subsequent remote plasma treatment to densify and shrink the first thickness of the $SiC_xO_yN_z$ film 506. Moreover, the first thickness can be controlled according to a desired treatment frequency of the subsequent remote plasma treatment operations.

The first thickness of the $SiC_xO_yN_z$ film 506 is deposited in the feature 504 of the substrate 502, where the feature 504 can take the shape of a trench, recess, or hole. The feature 504 can have a depth to lateral dimension aspect ratio of at least about 5:1, at least about 10:1, at least about 15:1, at least about 20:1, at least about 30:1, at least about 40:1, at least about 50:1, or at least about 100:1. For example, features having a high aspect ratio may be at least 10:1. The lateral dimension may be a width or diameter at the top of the feature 504. In some embodiments, the lateral dimension of the feature 504 may be less than about 200 nm, less than about 100 nm, between about 2 nm and about 100 nm, or between about 2 nm and about 50 nm. In some embodiments, the depth of the feature 504 may be between about 0.1 μm and about 100 μm, between about 0.5 μm and about 50 μm, between about 0.5 μm and about 25 μm, or between about 1 μm and about 25 μm.

The composition of the $SiC_xO_yN_z$ film 506 may affect an amount that the first thickness of the $SiC_xO_yN_z$ film 506 shrinks in a subsequent remote plasma exposure operation. In some implementations, the composition of the $SiC_xO_yN_z$ film 506 can have an atomic concentration of carbon between about 10% and about 40% or between about 10% and about 30%. In some implementations, the atomic concentration of carbon may be controlled by adjusting deposition parameters such as choice of precursors, flow rate of the precursors, choice of co-reactant, and flow rate of a co-reactant such as oxygen. For example, increasing the presence oxygen in the deposition of the $SiC_xO_yN_z$ film 506 can extract more carbon from the $SiC_xO_yN_z$ film 506. In some implementations, the atomic concentration of carbon in the $SiC_xO_yN_z$ film 506 is controlled during operation 500a so that conditions of remote hydrogen plasma exposure increase a size of an opening near a top surface of the feature 504 during operation 500b.

At operation 500b of the process 500, the $SiC_xO_yN_z$ film 506 is exposed to a remote hydrogen plasma under conditions that increase a size of an opening near a top surface of the feature 504. The remote hydrogen plasma is used to treat the first thickness of the $SiC_xO_yN_z$ film 506 so that the first thickness of the $SiC_xO_yN_z$ film 506 shrinks near the top surface of the feature 504. How much the first thickness of the $SiC_xO_yN_z$ film 506 shrinks near the top surface of the feature 504 can depend on the first thickness and composition of the $SiC_xO_yN_z$ film 506. How much the first thickness of the $SiC_xO_yN_z$ film 506 shrinks near the top surface of the feature 504 can also depend on the remote plasma conditions.

A remote plasma source for generating radicals of a source gas during deposition may also serve to generate radicals of the source gas during treatment to shrink the first thickness of the $SiC_xO_yN_z$ film 506 near the top surface of the feature 504. Accordingly, $SiC_xO_yN_z$ film deposition may occur in the same reaction chamber as $SiC_xO_yN_z$ film treatment. This allows alternating deposition and treatment cycles to be performed in the same tool. As a result, depositing the first thickness and exposing the first thickness of the $SiC_xO_yN_z$ film 506 to remote hydrogen plasma can occur without introducing a vacuum break (e.g., air break). A vacuum break can reduce throughput and introduce oxidation in the substrate 502, which can lead to higher electrical resistance and decreased performance.

Exposing the first thickness of the $SiC_xO_yN_z$ film 506 to the remote hydrogen plasma occurs without delivery of silicon-containing precursors. In other words, while depositing the first thickness of the $SiC_xO_yN_z$ film 506 involves flowing one or more silicon-containing precursors to react with hydrogen radicals of the remote hydrogen plasma, exposing the first thickness of the $SiC_xO_yN_z$ film 506 ceases the flow of silicon-containing precursors. A source gas including hydrogen gas can be provided with an inert carrier gas such as helium. In some embodiments, the source gas can include hydrogen, nitrogen, N—H containing species such as $NH_3$, oxygen, oxygen-containing species such as $H_2O$, $CO_2$, or $N_2O$, or combinations thereof. The source gas is provided in the remote plasma source, where hydrogen radicals are generated in the remote plasma source and introduced into the reaction chamber and towards the substrate 502. Once generated in the remote plasma source, the hydrogen radicals are in an excited energy state. The hydrogen radicals lose their energy or relax when they encounter the substrate 502 without recombining. The first thickness of the $SiC_xO_yN_z$ film 506 is exposed to a remote hydrogen plasma such that at least a substantial fraction of the hydrogen radicals are in a substantially low energy state or ground state. In some embodiments, at least 90% of the radicals of the source gas are hydrogen radicals in the ground state. Such hydrogen radicals of the remote hydrogen plasma are used to densify and shrink the first thickness of the $SiC_xO_yN_z$ film 506 near the top surface of the feature 504. Due at least in part to the minimal concentration of ions and the low energy state of the hydrogen radicals, exposing the $SiC_xO_yN_z$ film 506 to the remote hydrogen plasma does not generally cause damage to underlying layers of the substrate 502.

The thickness of the $SiC_xO_yN_z$ film 506 can be deposited according to a treatment frequency of each remote hydrogen plasma treatment. Thus, how much $SiC_xO_yN_z$ film 506 is deposited per deposition-treatment cycle is controlled to improve gapfill performance. At operation 500a, the first thickness of the $SiC_xO_yN_z$ film 506 is equal to or less than about 10 Å, equal to or less than about 5 Å, or between about 0.5 Å and about 4.5 Å. Accordingly, a thickness equal to or less than about 10 Å, equal to or less than about 5 Å, or between about 0.5 Å and about 4.5 Å of $SiC_xO_yN_z$ film 506 is deposited per deposition-treatment cycle. A higher treatment frequency corresponds to smaller thicknesses of $SiC_xO_yN_z$ film 506 deposited per cycle, where a higher treatment frequency may provide better gapfill performance.

The composition of the $SiC_xO_yN_z$ film 506 can be deposited so that the remote hydrogen plasma treatment has a greater effect on shrinking the first thickness of the $SiC_xO_yN_z$ film 506. Specifically, an atomic concentration of carbon in the $SiC_xO_yN_z$ film 506 can be tuned at operation 500a, where the atomic concentration of carbon is between about 10% and about 40% or between about 10% and about 30%. In some implementations, the increase in the size of the opening near the top surface of the feature 504 is greater when the atomic carbon concentration in the $SiC_xO_yN_z$ film 506 is lower. Where the atomic concentration of carbon is controlled, the size of the opening near the top surface of the feature 504 may be increased using the conditions of the remote hydrogen plasma. This can improve gapfill performance.

The conditions of the remote hydrogen plasma can be controlled to preferentially treat the first thickness of the $SiC_xO_yN_z$ film 506 near the top surface than near a bottom surface of the feature 504. The first thickness of the $SiC_xO_yN_z$ film 506 near the top surface of the feature 504 may be exposed to more hydrogen radicals of the remote hydrogen plasma than near the bottom surface. In some embodiments, treatment time and/or treatment frequency may be controlled so that diffusion or transport of the hydrogen radicals of the remote hydrogen plasma towards the bottom surface of the feature 504 is limited. For example, shorter treatment times may limit diffusion/transport of the hydrogen radicals from reaching the bottom surface of the feature 504.

In some embodiments, the treatment time of exposure to the remote hydrogen plasma is between about 0.5 seconds and about 120 seconds, between about 1 second and about 30 seconds, between about 2 seconds and about 20 seconds, or between about 5 seconds and about 15 seconds. In some embodiments, the treatment time of exposure to the remote hydrogen plasma is about 10 seconds. It will be understood that the treatment time may vary depending on the aspect ratio of the feature 504, where the treatment time is long enough to densify and shrink the first thickness of the $SiC_xO_yN_z$ film 506 but short enough to limit diffusion and transport of hydrogen radicals to the bottom surface of the feature 504.

The conditions of the remote hydrogen plasma can be controlled to increase the size of the opening near the top surface of the feature 504. In some embodiments, the size of the opening near the top surface of the feature 504 is increased more than a size of an opening near the bottom surface of the feature 504. Exposure to the remote hydrogen plasma can densify the $SiC_xO_yN_z$ film 506 by extracting hydrogen and promoting cross-linking so that more Si—O—Si and Si—C—Si bonds may form. Moreover, exposure to the remote hydrogen plasma can shrink the thickness of the $SiC_xO_yN_z$ film 506 under suitable conditions. In some embodiments, a treatment power can be controlled to facilitate densifying and shrinking the thickness of the $SiC_xO_yN_z$ film 506. In some embodiments, RF power of an inductively-coupled plasma can be tuned to control treatment power, where the RF power can be between about 300 Watts and 10 Kilowatts, between about 1 Kilowatt and about 8 Kilowatts, or between about 2 Kilowatts and about 6 Kilowatts. The RF power applied to the remote plasma source during treatment can be adjusted to increase generation of hydrogen radicals of the source gas. In some embodiments, the treatment power can be correlated at least in part with remote plasma gas composition. The remote plasma gas composition can include a concentration of source gas relative to carrier gas, where a greater concentration of source gas contributes to increased generation of radicals, thereby leading to a higher treatment power. In some embodiments, a concentration of a source gas (e.g., hydrogen gas) is at least 10% by volume with a balance of inert carrier gas, at least 15% by volume with a balance of inert carrier gas, at least 20% by volume with a balance of inert carrier gas, at least 25% by volume with a balance of inert carrier gas, between about 10% and about 50% by volume with a balance of inert carrier gas, or between about 10% and about 30% by volume with a balance of inert carrier gas. Specifically, a gas mixture can include hydrogen gas with a balance of an inert carrier gas such as helium, where the gas mixture includes at least 10% by volume hydrogen gas with the balance of helium, at least 15% by volume hydrogen gas with the balance of helium, at least 20% by volume hydrogen gas with the balance of helium, at least 25% by volume hydrogen gas with the balance of helium, between about 10% and about 50% by volume hydrogen gas with the balance of helium, or between about 10% and about 30% by volume hydrogen gas with the balance of helium. In contrast, typical gas mixtures include hydrogen gas at a concentration of 1-10% by volume with a balance of helium. Treatment power and remote plasma gas composition may be adjusted depending on the composition of the $SiC_xO_yN_z$ film 506. In some embodiments, treatment power may be reduced and/or hydrogen source gas concentration may be reduced in the remote hydrogen plasma treatment and still achieve an increase in the size of the opening near the top surface of the feature 504 where an atomic concentration of carbon in the $SiC_xO_yN_z$ film 506 is reduced.

The size of the opening near the top surface of the feature 504 can be measured using a lateral distance (e.g., diameter) along the top surface of the feature 504. Specifically, the size of the opening can be measured by a distance between opposite corners of the top surface of the feature 504 minus the thickness of the $SiC_xO_yN_z$ film 506 at the corners of the top surface of the feature 504. In some embodiments, the size of the opening near the top surface of the feature 504 after operation 500b can be increased by a percentage amount that is at least about 1%, at least about 5%, at least about 10%, at least about 20%, at least about 50%, at least about 100%, between about 1% and about 100%, between about 5% and about 100%, between about 1% and about 50%, or between about 5% and about 50%. By way of an example, the size of the opening near the top surface of the feature 504 can increase from 20 nm to an amount greater than 30 nm after operation 500b, which represents an increase of at least 50%.

In some embodiments, the size of the opening near the top surface of the feature 504 is increased more than the size of the opening near the bottom surface of the feature 504. The size of the opening near the bottom surface of the feature 504 can be measured using a lateral distance (e.g., diameter) along the bottom surface of the feature 504. Specifically, the size of the opening can be measured by a distance between opposite corners of the bottom surface of the feature 504 minus the thickness of the $SiC_xO_yN_z$ film 506 at the corners of the bottom surface of the feature 504. The bottom surface of the feature 504 refers to the lowest exposed surface as the feature 504 is filled by the $SiC_xO_yN_z$ film 506. After operation 500b, the size of the opening near the bottom surface of the feature 504 does not increase or increases by an amount less than the opening near the top surface of the feature 504.

In some embodiments, the conditions of the remote hydrogen plasma can be controlled so that the $SiC_xO_yN_z$ film 506 shrinks more at a top opening than at a bottom opening. The hydrogen radicals and/or ions of the remote plasma can be isotropic or substantially isotropic in nature so that treatment occurs preferentially at the top opening than at the bottom opening of the feature 504. Treatment frequency, treatment time, treatment power, and/or remote plasma gas composition can be controlled so that the size of the opening near the top surface of the feature 504 is increased more than the opening near the bottom surface of the feature 504. Composition and thickness of the $SiC_xO_yN_z$ film 506 can be controlled so that the size of the opening near the top surface of the feature 504 is increased more than the opening near the bottom surface of the feature 504.

It will be understood that parameters other than treatment frequency, treatment time, treatment power, remote plasma gas composition, composition of the $SiC_xO_yN_z$ film 506, and thickness of the $SiC_xO_yN_z$ film 506 can be controlled to shrink the $SiC_xO_yN_z$ film 506 at the top opening. Other tunable parameters include but are not limited to timing, gas composition, gas flow rates, chamber pressure, chamber temperature, substrate temperature, time interval between deposition and plasma treatment, and substrate position. These parameters can be tuned during exposure to the remote hydrogen plasma to influence the characteristics of the remote plasma, which can affect the size of the opening near the top surface of the feature 504. In some embodiments, the chamber pressure can be between about 0.2 Torr and about 5 Torr, or between about 1 Torr and about 3 Torr. In some embodiments, the chamber pressure can be greater than 3 Torr or greater than 5 Torr, where other process conditions (e.g., inert carrier gas) cause sufficient ionization and reduced residence times. In some embodiments, the source gas can be flowed with one or more co-reactants, such as $CO_2$, CO, $H_2O$, $CH_3OH$, $O_2$, $O_3$, $N_2$, $N_2O$, $NH_3$, $N_2H_2$, $CH_4$, $C_2H_6$, $C_2H_2$, $C_2H_4$, $B_2H_6$, or combinations thereof. Depending on the choice of the co-reactants, the one or more co-reactants can increase or decrease oxygen, nitrogen, or carbon content of the $SiC_xO_yN_z$ film 506. In some embodiments, the one or more co-reactants may include $CO_2$, $O_2$, $N_2$, $NH_3$, or combinations thereof. The presence of oxygen gas or oxygen radicals tends to extract carbon from Si—C bonds, thereby converting carbide to oxide.

In some embodiments, a time interval may be introduced between depositing the first thickness of the $SiC_xO_yN_z$ film 506 at operation 500a and exposing the first thickness of the $SiC_xO_yN_z$ film 506 to remote hydrogen plasma treatment at operation 500b. During the time interval, plasma is turned off and some gases continue to flow into the reaction chamber. In some embodiments, the gases may include the silicon-containing precursors flowed during deposition at operation 500a. During the time interval where plasma is turned off, residue deposition does not occur that may adversely affect gapfill performance. In some implementations, the time interval may be between about 1 second and about 30 seconds, such as about 5 seconds, about 10 seconds, or about 20 seconds.

At operation 500c of the process 500, a second thickness of the $SiC_xO_yN_z$ film 506 is deposited in the feature 504 of the substrate 502. The second thickness can be deposited on or over the first thickness of the $SiC_xO_yN_z$ film 506. Aspects of depositing the second thickness of the $SiC_xO_yN_z$ film 506 can be identical or at least similar to aspects of depositing the first thickness of the $SiC_xO_yN_z$ film 506. Specifically, where depositing the first thickness includes flowing one or more silicon-containing precursors into the reaction chamber and introducing hydrogen radicals generated from the remote plasma source to react with the one or more silicon-containing precursors during the operation 500a, depositing the second thickness includes repeating the aforementioned operation 500a in operation 500c. Deposition time, film thickness, chamber pressure, chamber temperature, substrate temperature, RF power levels, gas flow, gas composition, and other parameters in operation 500c may be the same or different than in operation 500a. The first thickness of the $SiC_xO_yN_z$ film 506 is deposited by a remote plasma CVD process, and the second thickness of the $SiC_xO_yN_z$ film 506 is deposited by a remote plasma CVD process, where the remote plasma CVD process deposits the second thickness of the $SiC_xO_yN_z$ film 506 on the surface of the substrate 502 under relatively mild conditions adjacent to the substrate 502. Such relatively mild conditions are described in operation 500a.

In some embodiments, the second thickness of the $SiC_xO_yN_z$ film 506 may have a conformality of at least about 75%, at least about 80%, at least about 85%, at least about 90%, at least about 95%, or at least about 98%. The second thickness of the $SiC_xO_yN_z$ film 506 may be equal to or less than about 10 Å, or equal to or less than about 5 Å. In some embodiments, the second thickness of the $SiC_xO_yN_z$ film 506 may be between about 0.5 Å and about 5 Å, or between about 0.5 Å and about 4.5 Å.

Deposition of the second thickness of the $SiC_xO_yN_z$ film 506 may occur in the same reaction chamber as treatment of the $SiC_xO_yN_z$ film 506 and deposition of the first thickness of the $SiC_xO_yN_z$ film 506. As a result, depositing the second thickness of the $SiC_xO_yN_z$ film 506 can occur without introducing a vacuum break (e.g., air break) between operations.

The operation 500c of the process 500 may further include repeating operations of 500b and 500a until the feature 504 is filled or substantially filled. As used herein, "substantially filled" with respect to filling the feature 504 can refer to having the $SiC_xO_yN_z$ film 506 occupy at least 98% of a volume the feature 504. Seams and/or voids 508 may form when the feature 504 is substantially filled with the $SiC_xO_yN_z$ film 506. However, deposition by remote plasma CVD and remote hydrogen plasma exposure as described in the present disclosure can eliminate formation of seams and/or voids 508 or at least minimize the sizes of seams and/or voids 508.

Repeating operations of 500b and 500a in operation 500c can include repeating: (i) exposing the $SiC_xO_yN_z$ film 506 to remote hydrogen plasma so that a size of an opening at the top surface of the feature 504 is increased and (ii) depositing a new thickness of the $SiC_xO_yN_z$ film 506 in the feature 504. In some embodiments, treatment frequency, treatment time, treatment power, and/or remote plasma gas composition are identical in operation 500c to the treatment frequency, treatment time, treatment power, and/or remote plasma gas composition in operations 500b and 500a. For example, a treatment frequency of 5 Å or less per deposition-treatment cycle, a treatment time of between about 0.5 seconds and 120 seconds, a treatment power of an applied RF power between about 1 Kilowatt and about 8 Kilowatts, and a remote plasma gas composition having a concentration between about 10% and about 50% by volume of hydrogen with a balance of helium can be provided until the feature 504 is filled or at least substantially filled. The conditions of the remote hydrogen plasma during repeated operations 500b in operation 500c are controlled so that the size of the opening near the top surface of the feature 504 is increased. In some embodiments, the size of the opening near the top surface of the feature 504 is increased more than the opening near the bottom surface of the feature 504 when repeating operations 500b in operation 500c. Gapfill is completed when one of the repeated operations 500a in operation 500c closes off the opening of the feature 504.

In some embodiments, a time interval may be introduced between depositing the second thickness of the $SiC_xO_yN_z$ film 506 at operation 500c and repeating operation 500b (i.e., plasma treatment). During the time interval, plasma is turned off and some gases continue to flow into the reaction chamber. In some embodiments, the gases may include the hydrogen gas, inert carrier gas, and/or co-reactant gas flowed during plasma treatment at operation 500b. During the time interval where plasma is turned off, residue deposition does not occur that may adversely affect gapfill performance. In some implementations, the time interval may be between about 1 second and about 30 seconds, such as about 5 seconds, about 10 seconds, or about 20 seconds. Generally speaking, various time intervals may occur between plasma deposition and plasma treatment operations to modulate gapfill performance. This means that the time intervals may occur in a transition from deposition to plasma treatment, and/or in a transition from plasma treatment back to deposition.

In some embodiments, parameters of treatment frequency, treatment time, treatment power, and/or remote plasma gas composition may be adjusted depending on the geometry of the feature 504. Depending on an aspect ratio of the feature 504, the treatment frequency, treatment time, treatment power, and/or remote plasma gas composition may vary. The treatment frequency, for example, can be flexibly tuned based on an incoming feature geometry to reshape the filling of the feature 504 and improve gapfill performance. That way, how much thickness of the $SiC_xO_yN_z$ film 506 is deposited per deposition-treatment cycle can be tuned to minimize formation of seams and/or voids 508 while maintaining reasonable throughput.

The $SiC_xO_yN_z$ film 506 deposited by remote plasma CVD in the present disclosure has high etch selectivity to both oxide and nitride materials, where the $SiC_xO_yN_z$ film 506 has an etch selectivity of at least 7:1 under dry etch or wet etch conditions against oxide and nitride materials. The $SiC_xO_yN_z$ film 506 may have excellent electrical properties including high breakdown voltages and low leakage currents. In addition, the $SiC_xO_yN_z$ film 506 may have a low dielectric constant (low-k), where the effective dielectric constant of the $SiC_xO_yN_z$ film 506 is about 4.0 or lower, about 3.5 or lower, about 3.0 or lower, or about 2.5 or lower.

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648 to Varadarajan et al., filed Oct. 24, 2013, titled "GROUND STATE HYDROGEN RADICAL SOURCES FOR CHEMICAL VAPOR DEPOSITION OF SILICON-CARBON-CONTAINING FILMS," which is incorporated herein by reference in its entirety and for all purposes.

Figure 6:
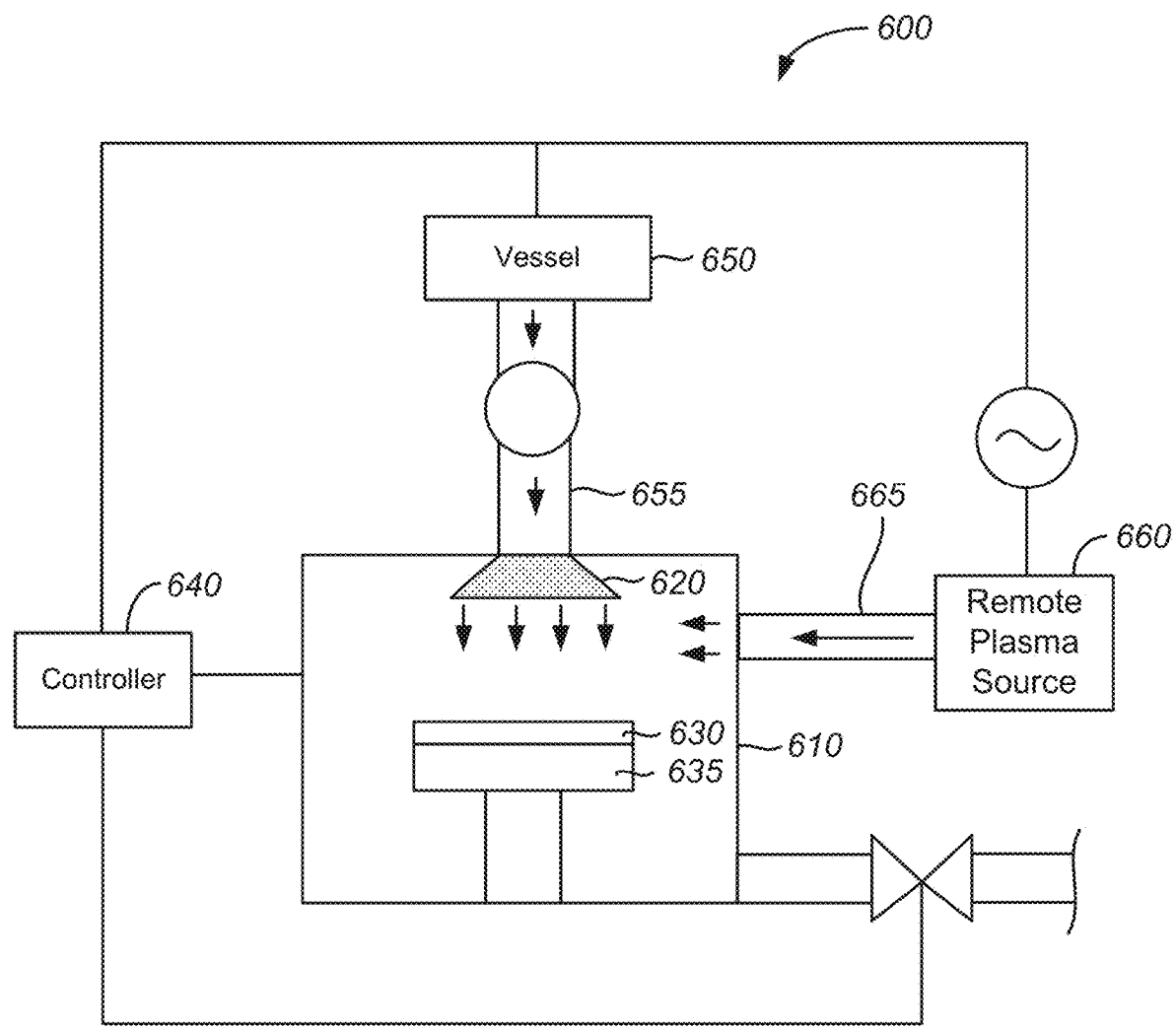
FIG. 6 illustrates a schematic diagram of an example plasma processing apparatus with a remote plasma source according to some implementations.

FIG. 6 presents a schematic diagram of a remote plasma apparatus according to certain embodiments. The device 600 includes a reaction chamber 610 with a showerhead 620. Inside the reaction chamber 610, a substrate 630 rests on a stage or pedestal 635. In some embodiments, the pedestal 635 can be fitted with a heating/cooling element. A controller 640 may be connected to the components of the device 600 to control the operation of the device 600. For example, the controller 640 may contain instructions for controlling process conditions for the operations of the device 600, such as the temperature process conditions and/or the pressure process conditions. In some embodiments, the controller 640 may contain instructions for controlling the flow rates of precursor gas, co-reactant gas, source gas, and carrier gas. The controller 640 may contain instructions for controlling the treatment frequency, treatment time, treatment power, and remote plasma gas composition of remote hydrogen plasma. A more detailed description of the controller 640 is provided below.

During operation, gases or gas mixtures are introduced into the reaction chamber 610 via one or more gas inlets coupled to the reaction chamber 610. In some embodiments, two or more gas inlets are coupled to the reaction chamber 610. A first gas inlet 655 can be coupled to the reaction chamber 610 and connected to a vessel 650, and a second gas inlet 665 can be coupled to the reaction chamber 610 and connected to a remote plasma source 660. In embodiments including remote plasma configurations, the delivery lines for the precursors and the radical species generated in the remote plasma source 660 are separated. Hence, the precursors and the radical species do not substantially interact before reaching the substrate 630. It will be understood that in some implementations the gas lines may be reversed so that the vessel 650 may provide precursor gas flow through the second gas inlet 665 and the remote plasma source 660 may provide ions and radicals through the first gas inlet 655.

One or more radical species may be generated in the remote plasma source 660 and configured to enter the reaction chamber 610 via the second gas inlet 665. Any type of plasma source may be used in remote plasma source 660 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 660 can be the GAMMA®, manufactured by Lam Research Corporation of Fremont, California. Another example of such a RF remote plasma source 660 can be the Astron®, manufactured by MKS Instruments of Wilmington, Massachusetts, which can be operated at 440 kHz and can be provided as a subunit bolted onto a larger apparatus for processing one or more substrates in parallel. In some embodiments, a microwave plasma can be used as the remote plasma source 660, such as the Astex®, also manufactured by MKS Instruments. A microwave plasma can be configured to operate at a frequency of 2.45 GHz. Gas provided to the remote plasma source 660 may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-50% by volume during deposition operations, and hydrogen gas may be provided in a helium carrier at a concentration of at least about 10% by volume during treatment operations.

The precursors can be provided in vessel 650 and can be supplied to the showerhead 620 via the first gas inlet 655. The showerhead 620 distributes the precursors into the reaction chamber 610 toward the substrate 630. The substrate 630 can be located beneath the showerhead 620. It will be appreciated that the showerhead 620 can have any suitable shape, and may have any number and arrangement of ports for distributing gases to the substrate 630. The precursors can be supplied to the showerhead 620 and ultimately to the substrate 630 at a controlled flow rate.

The one or more radical species formed in the remote plasma source 660 can be carried in the gas phase toward the substrate 630. The one or more radical species can flow through a second gas inlet 665 into the reaction chamber 610. It will be understood that the second gas inlet 665 need not be transverse to the surface of the substrate 630 as illustrated in FIG. 6. In certain embodiments, the second gas inlet 665 can be directly above the substrate 630 or in other locations. The distance between the remote plasma source 660 and the reaction chamber 610 can be configured to provide mild reactive conditions such that the ionized species generated in the remote plasma source 660 are substantially neutralized, but at least some radical species in substantially low energy states remain in the environment adjacent to the substrate 630. Such low energy state radical species are not recombined to form stable compounds. The distance between the remote plasma source 660 and the reaction chamber 610 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 610), and other factors. In some embodiments, the distance between the remote plasma source 660 and the reaction chamber 610 can be between about 1 cm and 30 cm, such as about 5 cm or about 15 cm.

In some embodiments, a co-reactant, which is not the primary silicon-containing precursor or a hydrogen radical, is introduced during the deposition reaction. In some implementations, the device 600 is configured to introduce the co-reactant through the second gas inlet 665, in which case the co-reactant is at least partially converted to plasma. In some implementations, the device 600 is configured to introduce the co-reactant through the showerhead 620 via the first gas inlet 655. Examples of the co-reactant include oxygen, nitrogen, ammonia, carbon dioxide, carbon monoxide, and the like.

Figure 7:
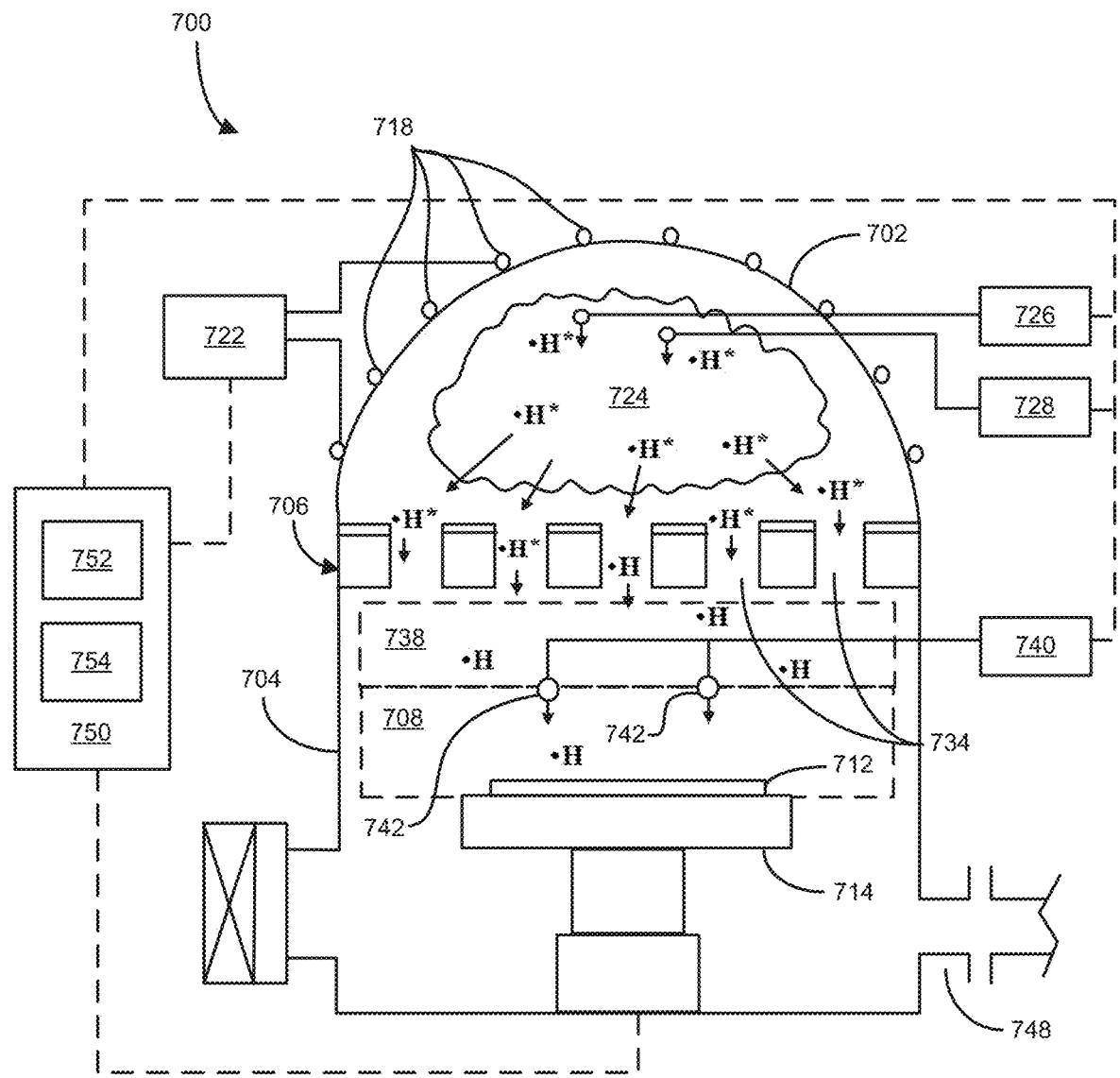
FIG. 7 illustrates a schematic diagram of an example plasma processing apparatus with a remote plasma source according to some other implementations.

FIG. 7 illustrates a schematic diagram of an example plasma processing apparatus with a remote plasma source according to some other implementations. The plasma processing apparatus 700 includes the remote plasma source 702 separated from a reaction chamber 704. The remote plasma source 702 is fluidly coupled with the reaction chamber 704 via a multiport gas distributor 706, which may also be referred to as a showerhead. Radical species are generated in the remote plasma source 702 and supplied to the reaction chamber 704. One or more silicon-containing precursors are supplied to the reaction chamber 704 downstream from the remote plasma source 702 and from the multiport gas distributor 706. The one or more silicon-containing precursors react with the radical species in a chemical vapor deposition zone 708 of the reaction chamber 704 to deposit a $SiC_xO_yN_z$ film on a surface of a substrate 712. The chemical vapor deposition zone 708 includes an environment adjacent to the surface of the substrate 712.

The substrate 712 is supported on a substrate support or pedestal 714. The pedestal 714 may move within the reaction chamber 704 to position the substrate 712 within the chemical vapor deposition zone 708. In the embodiment shown in FIG. 7, pedestal 714 is shown having elevated the substrate 712 within the chemical vapor deposition zone 708. The pedestal 714 may also adjust the temperature of the substrate 712 in some embodiments, which can provide some selective control over thermally activated surface reactions on the substrate 712.

FIG. 7 shows a coil 718 arranged around the remote plasma source 702, where the remote plasma source 702 includes an outer wall (e.g., quartz dome). The coil 718 is electrically coupled to a plasma generator controller 722, which may be used to form and sustain plasma within a plasma region 724 via inductively coupled plasma generation. In some implementations, the plasma generator controller 722 may include a power supply for supplying power to the coil 718, where the power can be in a range between about 1 and 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 724, radical species may continuously be generated using plasma excitation during film deposition and treatment. In some implementations, hydrogen radicals are generated under approximately steady-state conditions during steady-state film deposition, though transients may occur at the beginning and end of film deposition and treatment.

A supply of hydrogen radicals may be continuously generated within the plasma region 724 while hydrogen gas or other source gas is being supplied to the remote plasma source 702. Excited hydrogen radicals may be generated in the remote plasma source 702. If not re-excited or re-supplied with energy, or re-combined with other radicals, the excited hydrogen radicals lose their energy, or relax. Thus, excited hydrogen radicals may relax to form hydrogen radicals in a substantially low energy state or ground state.

The hydrogen gas or other source gas may be diluted with one or more additional gases. These one or more additional gases may be supplied to the remote plasma source 702. In some implementations, the hydrogen gas or other source gas is mixed with one or more additional gases to form a gas mixture, where the one or more additional gases can include a carrier gas. Non-limiting examples of additional gases can include helium, neon, argon, krypton, and xenon. The one or more additional gases may support or stabilize steady-state plasma conditions within the remote plasma source 702 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 702. As shown in FIG. 7, a source gas supply 726 is fluidly coupled with the remote plasma source 702 for supplying the hydrogen gas or source gas. In addition, an additional gas supply 728 is fluidly coupled with the remote plasma source 702 for supplying the one or more additional gases. The one or more additional gases may also include a co-reactant gas as described above. While the embodiment in FIG. 7 depicts the gas mixture of the source gas and the one or more additional gases being introduced through separate gas outlets, it will be understood that the gas mixture may be introduced directly into the remote plasma source 702. That is, a pre-mixed dilute gas mixture may be supplied to the remote plasma source 702 through a single gas outlet.

Gases, such as excited hydrogen and helium radicals and relaxed gases/radicals, flow out of the remote plasma source 702 and into the reaction chamber 704 via multiport gas distributor 706. Gases within the multiport gas distributor 706 and within the reaction chamber 704 are generally not subject to continued plasma excitation therein. In some implementations, the multiport gas distributor 706 includes an ion filter and/or a photon filter. Filtering ions and/or photons may reduce substrate damage, undesirable re-excitation of molecules, and/or selective breakdown or decomposition of silicon-containing precursors within the reaction chamber 704. Multiport gas distributor 706 may have a plurality of gas ports 734 to diffuse the flow of gases into the reaction chamber 704. In some implementations, the plurality of gas ports 734 may be mutually spaced apart. In some implementations, the plurality of gas ports 734 may be arranged as an array of regularly spaced apart channels or through-holes extending through a plate separating the remote plasma source 702 and the reaction chamber 704. The plurality of gas ports 734 may smoothly disperse and diffuse exiting radicals from the remote plasma source 702 into the reaction chamber 704.

Typical remote plasma sources are far removed from reaction vessels. Consequently, radical extinction and recombination, e.g., via wall collision events, may reduce active species substantially. In contrast, in some implementations, dimensions for the plurality of gas ports 734 may be configured in view of the mean free path or gas flow residence time under typical processing conditions to aid the free passage of radicals into the reaction chamber 704. In some implementations, openings for the plurality of gas ports 734 may occupy between about 5% and about 20% of an exposed surface area of the multiport gas distributor 706. In some implementations, the plurality of gas ports 734 may each have an axial length to diameter ratio of between about 3:1 and 10:1 or between about 6:1 and about 8:1. Such aspect ratios may reduce wall-collision frequency for radical species passing through the plurality of gas ports 734 while providing sufficient time for a majority of excited state radical species to relax to ground state radical species. In some implementations, dimensions of the plurality of gas ports 734 may be configured so that the residence time of gases passing through the multiport gas distributor 706 is greater than the typical energetic relaxation time of an excited state radical species. Excited state radical species for hydrogen source gas may be denoted by ·H* in FIG. 7 and ground state radical species for hydrogen source gas may be denoted by ·H in FIG. 7.

In some implementations, excited state radical species exiting the plurality of gas ports 734 may flow into a relaxation zone 738 contained within an interior of the reaction chamber 704. The relaxation zone 738 is positioned upstream of the chemical vapor deposition zone 708 but downstream of the multiport gas distributor 706. Substantially all or at least 90% of the excited state radical species exiting the multiport gas distributor 706 will transition into relaxed state radical species in the relaxation zone 738. Put another way, almost all of the excited state radical species (e.g., excited hydrogen radicals) entering the relaxation zone 738 become de-excited or transition into a relaxed state radical species (e.g., ground state hydrogen radicals) before exiting the relaxation zone 738. In some implementations, process conditions or a geometry of the relaxation zone 738 may be configured so that the residence time of radical species flowing through the relaxation zone 738, e.g., a time determined by mean free path and mean molecular velocity, results in relaxed state radical species flowing out of the relaxation zone 738.

With the delivery of radical species to the relaxation zone 738 from the multiport gas distributor 706, one or more silicon-containing precursors and/or one or more co-reactants may be introduced into the chemical vapor deposition zone 708. The one or more silicon-containing precursors may be introduced via a gas distributor or gas outlet 742, where the gas outlet 742 may be fluidly coupled with a precursor supply source 740. The relaxation zone 738 may be contained within a space between the multiport gas distributor 706 and the gas outlet 742. The gas outlet 742 may include mutually spaced apart openings so that the flow of the one or more silicon-containing precursors may be introduced in a direction parallel with gas mixture flowing from the relaxation zone 738. The gas outlet 742 may be located downstream from the multiport gas distributor 706 and the relaxation zone 738. The gas outlet 742 may be located upstream from the chemical vapor deposition zone 708 and the substrate 712. The chemical vapor deposition zone 708 is located within the interior of the reaction chamber 704 and between the gas outlet 742 and the substrate 712.

Substantially all of the flow of the one or more silicon-containing precursors may be prevented from mixing with excited state radical species adjacent to the multiport gas distributor 706. Relaxed or ground state radical species mix in a region adjacent to the substrate 712 with the one or more silicon-containing precursors. The chemical vapor deposition zone 708 includes the region adjacent to the substrate 712 where the relaxed or ground state radical species mix with the one or more silicon-containing precursors. The relaxed or ground state radical species mix with the one or more silicon-containing precursors in the gas phase during CVD formation of an $SiC_xO_yN_z$ film. However, the relaxed or ground state radical species do not mix with any silicon-containing precursors in the gas phase during densification and shrinkage of the $SiC_xO_yN_z$ film.

In some implementations, a co-reactant may be introduced from the gas outlet 742 and flowed along with the one or more silicon-containing precursors. The co-reactant may be introduced downstream from the remote plasma source 702. The co-reactant may be supplied from the precursor supply source 740 or other source (not shown) fluidly coupled to the gas outlet 742. In some implementations, a co-reactant may be introduced from the multiport gas distributor 706 and flowed along with the radical species generated in the remote plasma source 702 and into the reaction chamber 704. This may include radicals and/or ions of a co-reactant gas provided in the remote plasma source 702. The co-reactant may be supplied from the additional gas supply 728.

The gas outlet 742 may be separated from the multiport gas distributor 706 by a sufficient distance to prevent back diffusion or back streaming of the one or more silicon-containing precursors. In some implementations, the gas outlet 742 may be separated from the plurality of gas ports 734 by a distance between about 0.5 inches and about 5 inches, or between about 1.5 inches and about 4.5 inches, or between about 1.5 inches and about 3 inches.

Process gases may be removed from the reaction chamber 704 via an outlet 748 configured that is fluidly coupled to a pump (not shown). Thus, excess silicon-containing precursors, co-reactants, radical species, and diluent and displacement or purge gases may be removed from the reaction chamber 704. In some implementations, a system controller 750 is in operative communication with the plasma processing apparatus 700. In some implementations, the system controller 750 includes a processor system 752 (e.g., microprocessor) configured to execute instructions held in a data system 754 (e.g., memory). In some implementations, the system controller 750 may be in communication with the plasma generator controller 722 to control plasma parameters and/or conditions. In some implementations, the system controller 750 may be in communication with the pedestal 714 to control pedestal elevation and temperature. In some implementations, the system controller 750 may control other processing conditions, such as RF power settings, frequency settings, duty cycles, pulse times, pressure within the reaction chamber 704, pressure within the remote plasma source 702, gas flow rates from the source gas supply 726 and the additional gas supply 728, gas flow rates from the precursor supply source 740 and other sources, temperature of the pedestal 714, and temperature of the reaction chamber 704, among others.

Aspects of the controller 750 of FIG. 7 described below also apply to the controller 640 of FIG. 6. The controller 750 may contain instructions for controlling process conditions for the operation of the plasma processing apparatus 700. The controller 750 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 750 or they may be provided over a network.

In certain embodiments, the controller 750 controls all or most activities of the plasma processing apparatus 700 described herein. For example, the controller 750 may control all or most activities of the plasma processing apparatus 700 associated with depositing an $SiC_xO_yN_z$ film and, optionally, other operations in a fabrication flow that includes the $SiC_xO_yN_z$ film. The controller 750 may execute system control software including sets of instructions for controlling the treatment frequency, treatment time, treatment power, and remote plasma gas composition of remote plasma conditions for gapfill operations. The controller 750 may also execute system control software including sets of instructions for controlling timing, time interval between deposition and plasma treatment operations, gas composition, gas flow rates, chamber pressure, chamber temperature, substrate position, and/or other parameters. Other computer programs, scripts, or routines stored on memory devices associated with the controller 750 may be employed in some embodiments. To provide relatively mild reactive conditions at the environment adjacent to the substrate 712, parameters such as the RF power levels, gas flow rates to the plasma region 724, gas flow rates to the chemical vapor deposition zone 708, and timing of the plasma ignition can be adjusted and maintained by controller 750. Additionally, adjusting the substrate position may further reduce the presence of high-energy radical species at the environment adjacent to the substrate 712. In a multi-station reactor, the controller 750 may comprise different or identical instructions for different apparatus stations, thus allowing the apparatus stations to operate either independently or synchronously.

In some embodiments, the controller 750 may include instructions for performing operations such depositing a first thickness of a $SiC_xO_yN_z$ film in one or more features of the substrate 712, exposing the $SiC_xO_yN_z$ film to a remote hydrogen plasma under conditions that increase a size of an opening near a top surface of each of the one or more features, and depositing a second thickness of the $SiC_xO_yN_z$ film is deposited in the one or more features of the substrate 712. In depositing the first thickness and the second thickness of the $SiC_xO_yN_z$ film, the controller 750 may include instructions for flowing one or more silicon-containing precursors into the reaction chamber 704 and introducing one or more hydrogen radicals generated from the remote plasma source 702 and towards the substrate 712 in the reaction chamber 704, where the one or more hydrogen radicals react with the one or more silicon-containing precursors to deposit the $SiC_xO_yN_z$ film. In some embodiments, the controller 750 may further include instructions for controlling an atomic concentration of the $SiC_xO_yN_z$ film so that the conditions of the remote hydrogen plasma increase the size of the opening near the top surface of each of the one or more features. In some embodiments, the controller 750 may further include instructions for repeating operations of exposing the $SiC_xO_yN_z$ film to the remote hydrogen plasma and depositing a new thickness of the $SiC_xO_yN_z$ film in the one or more features of the substrate 712 until the one or more features are filled or at least substantially filled. In some embodiments, the conditions of the remote hydrogen plasma include a treatment frequency, treatment time, treatment power, and/or remote plasma gas composition being controlled so that the size of the opening near the top surface of each of the one or more features is increased more than a size of an opening near a bottom surface of each of the one or more features. In some embodiments, the treatment power of the remote hydrogen plasma includes a concentration between about 10% and about 50% by volume of hydrogen, or a concentration between about 10% and about 30% by volume of hydrogen. In some embodiments, the first thickness and the second thickness of the $SiC_xO_yN_z$ film is each between about 0.5 Å and about 10 Å, or between about 0.5 Å and about 4.5 Å.

In some embodiments, the apparatus 700 may include a user interface associated with controller 750. The user interface may include a display screen, graphical software displays of the apparatus 700 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the doped or undoped silicon carbide deposition and treatment described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Figure 8:
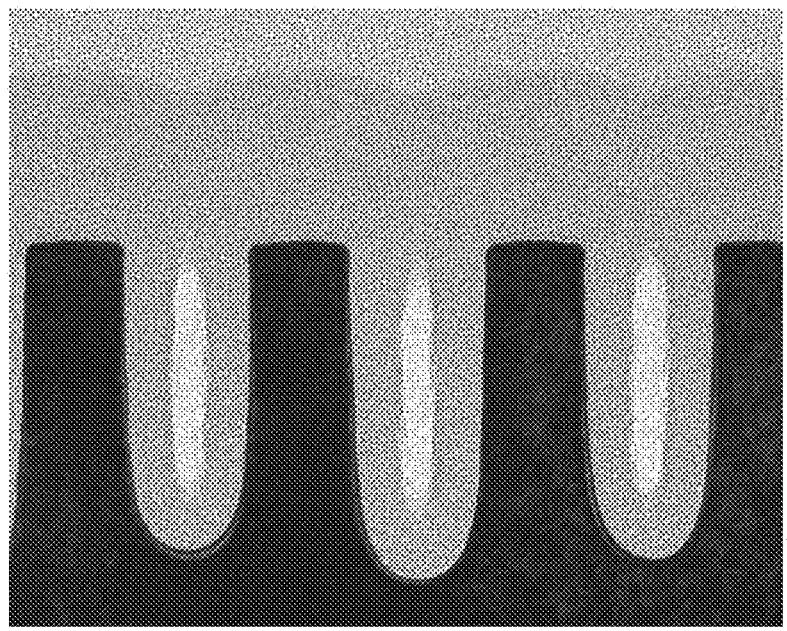
FIG. 8 shows a TEM image of an $SiC_xO_yN_z$ film deposited in a plurality of features of a substrate according to some implementations.

FIG. 8 shows a TEM image of an $SiC_xO_yN_z$ film deposited in a plurality of features of a substrate according to some implementations. The $SiC_xO_yN_z$ film serves as gapfill material in the plurality of features. The $SiC_xO_yN_z$ film may include silicon oxycarbide. The $SiC_xO_yN_z$ film may be deposited by alternating remote plasma CVD and remote hydrogen plasma exposure operations. The treatment frequency is greater than about 10 Å per deposition-treatment cycle, the treatment power of the remote hydrogen plasma has a concentration of between 1-5% hydrogen by volume with a balance of helium, and the treatment time of the remote hydrogen plasma exposure is at least 10 seconds. Voids are formed in each of the plurality of features in FIG. 8.

Figure 9:
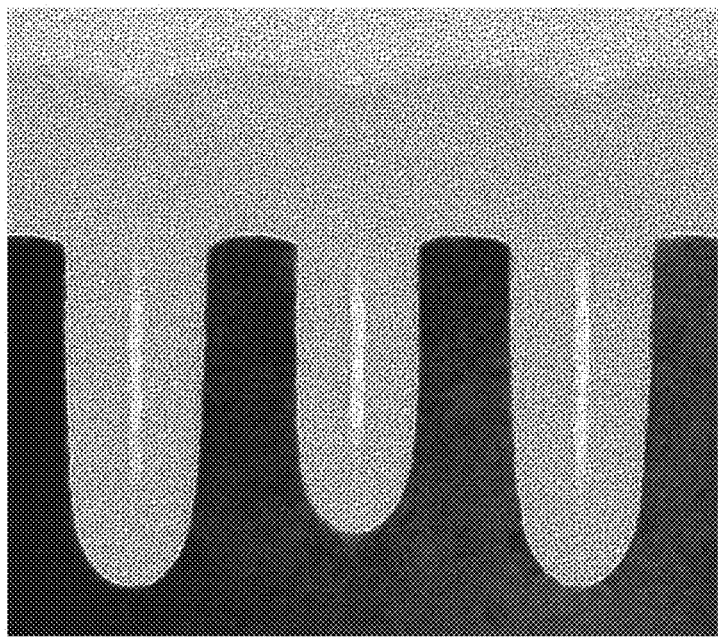
FIG. 9 shows a TEM image of an $SiC_xO_yN_z$ film deposited in a plurality of features of a substrate according to some implementations.

FIG. 9 shows a TEM image of a $SiC_xO_yN_z$ film deposited in a plurality of features of a substrate according to some implementations. The $SiC_xO_yN_z$ film serves as gapfill material in the plurality of features. The $SiC_xO_yN_z$ film may include silicon oxycarbide. The $SiC_xO_yN_z$ film may be deposited by alternating remote plasma CVD and remote hydrogen plasma exposure operations. Various time intervals may be introduced between remote plasma CVD and remote hydrogen plasma exposure operations to modulate gapfill performance. However, the remote hydrogen plasma exposure conditions are controlled to limit the sizes of the voids formed in FIG. 9. The treatment frequency is equal to or less than 5 Å per deposition-treatment cycle, the treatment power of the remote hydrogen plasma is between about 2 Kilowatts and about 6 Kilowatts, and the remote plasma gas composition has a concentration of between about 10% and about 50% by volume of hydrogen with a balance of helium, and the treatment time of the remote hydrogen plasma exposure is between about 0.5 seconds and about 120 seconds. Voids are formed in each of the plurality of features in FIG. 9, but the voids are significantly smaller compared to FIG. 8.

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus (700) for depositing a doped or undoped silicon carbide (SiCxOyNz) film in one or more features of a substrate (712), the apparatus (700) comprising:
   a reaction chamber (704) including a substrate support (714) for supporting the substrate (712);
   a precursor supply source (740) configured to supply a silicon-containing precursor through a gas outlet (742) into the reaction chamber (704); and a remote plasma source (702) separate from and upstream of the reaction chamber (704), wherein the remote plasma source (702) is configured to generate a remote hydrogen plasma and deliver the remote hydrogen plasma through a multiport gas distributor (706) into the reaction chamber (704); and a controller (750) configured with instructions to perform the following operations:

deposit a first thickness of the SiCxOyNz film in the one or more features of the substrate (712), wherein x has a value greater than zero, y has a value equal to or greater than zero, and z has a value equal to or greater than zero;

expose the first thickness of the SiCxOyNz film to the remote hydrogen plasma under conditions that increase a size of an opening near a top surface of each of the one or more features, wherein a concentration of hydrogen for the remote hydrogen plasma is at least 15% by volume with a balance of the inert carrier gas; and deposit a second thickness of the SiCxOyNz film after exposing the first thickness of the SiCxOyNz film to the remote hydrogen plasma, wherein each of the first thickness and the second thickness is between 0.5 Å and 4.5 Å.

2. The apparatus of claim 1, wherein the controller (750) is configured to repeat operations of exposing the SiCxOyNz film to the remote hydrogen plasma and depositing the SiCxOyNz film in the one or more features until the one or more features are filled or substantially filled.

3. The apparatus of claim 1, wherein the controller (750) is configured with instructions to control conditions of the remote hydrogen plasma generated in the remote plasma source (702) including at least one of a treatment time, a treatment frequency, a treatment power, or a remote plasma gas composition, wherein at least one of the treatment time, the treatment frequency, the treatment power, or the remote plasma gas composition are controlled so that the size of the opening near the top surface of each of the one or more features is increased relative to a size of an opening near a bottom surface of each of the one or more features.

4. The apparatus of claim 1, wherein the controller (750) is configured with instructions to expose the first thickness of the SiCxOyNz film to the remote hydrogen plasma with the treatment time being between about 0.5 seconds and about 120 seconds.

5. The apparatus of claim 4, wherein the controller (750) is configured with instructions to expose the first thickness of the SiCxOyNz film to the remote hydrogen plasma with the treatment time being between about 2 seconds and about 20 seconds.

6. The apparatus of claim 1, wherein the controller (750) is configured with instructions to expose the first thickness of the SiCxOyNz film to the remote hydrogen plasma having a concentration of hydrogen that is at least 25% by volume with a balance of inert carrier gas.

7. The apparatus of claim 1, wherein an atomic concentration of carbon in the SiCxOyNz is between 10% and 40%.

8. The apparatus of claim 1, wherein the controller (750) configured with instructions to deposit a first thickness of the SiCxOyNz film, to expose the first thickness of the SiCxOyNz film to remote hydrogen plasma, and to deposit the second thickness of the SiCxOyNz film is configured to perform said operations in the reaction chamber (704).

9. An apparatus (700) for depositing a low-k gapfill material in one or more features of a substrate (712), the apparatus (700) comprising:

a reaction chamber (704) including a substrate support (714) for supporting the substrate (712);

a precursor supply source (740) configured to supply a deposition precursor through a gas outlet (742) into the reaction chamber (704);

a remote plasma source (702) separate from and upstream of the reaction chamber (704), wherein the remote plasma source (702) is configured to generate reactant radicals and introduce the reactant radicals through a showerhead (706) into the reaction chamber (704) towards the substrate (712), wherein the reactant radicals react with the deposition precursor to deposit a first thickness of the low-k gapfill material in the one or more features of the substrate (712); and a controller (750) configured with instructions for performing the following operations:

(a) deposit the first thickness of the low-k gapfill material in the one or more features of the substrate (712);

(b) expose the low-k gapfill material to remote hydrogen plasma to treat the low-k gapfill material, wherein a concentration of hydrogen for the remote hydrogen plasma is at least 15% by volume with a balance of inert carrier gas; and (c) repeat operations (a) and (b) until the one or more features of the substrate (712) are filled or substantially filled with the low-k gapfill material, wherein a thickness of the low-k gapfill material is between 0.5 Å and 4.5 Å per deposition-exposure cycle.

10. The apparatus of claim 9, wherein the controller (750) is configured with instructions for depositing the first thickness of the low-k gapfill material conformally in the one or more features of the substrate (712), wherein the first thickness of the low-k gapfill material has a conformality of at least 80%.

11. The apparatus of claim 9, further comprising:

a source gas supply (726) fluidly coupled to the remote plasma source (702) and configured to supply a source gas to the remote plasma source (702), wherein the source gas comprises a mixture of hydrogen gas and an inert gas, and wherein a concentration of the source gas is at least 25% by volume of hydrogen gas with a balance of the inert gas.

12. The apparatus of claim 9, further comprising:

an additional gas supply (728) fluidly coupled with the remote plasma source (702) and configured to supply a co-reactant to the remote plasma source (702), wherein the remote plasma source (702) is configured to introduce the co-reactant into the reaction chamber (704), and wherein the reactant radicals react with the co-reactant and the deposition precursor to deposit the first thickness of the low-k gapfill material.

13. The apparatus of claim 12, wherein the controller (750) is configured to tune a composition of the low-k gapfill material by the co-reactant.

14. The apparatus of claim 9, wherein the low-k gapfill material comprises doped or undoped silicon carbide, wherein an atomic concentration of carbon in the first thickness of the low-k gapfill material is between about 10% and about 40%.

15. The apparatus of claim 9, wherein the controller (750) configured with instructions for exposing the low-k gapfill material to remote hydrogen plasma is configured with instructions for modulating at least one of a treatment time, a treatment frequency, a treatment power, or a remote plasma gas composition to densify and shrink the first thickness of the low-k gapfill material during exposure to the remote hydrogen plasma.

16. The apparatus of claim 9, wherein operations (a) and (b) are performed without introducing a vacuum break in between the operations.

17. An apparatus (700) for depositing silicon carbide gapfill material in one or more features of a substrate (712), the apparatus (700) comprising:

a reaction chamber (704) including a substrate support (714) for supporting the substrate (712);

a precursor supply source (740) configured to supply a silicon-containing precursor through a gas outlet (742) into the reaction chamber (704);

a remote plasma source (702) separate from and upstream of the reaction chamber (704), wherein the remote plasma source (702) is configured to generate reactant radicals and introduce the reactant radicals through a showerhead (706) into the reaction chamber (704) towards the substrate (712), wherein the reactant radicals react with the silicon-containing precursor to deposit a first thickness of the silicon carbide gapfill material in the one or more features of the substrate (712); and a controller (750) configured with instructions for performing the following operations:

(a) deposit the first thickness of the silicon carbide gapfill material in the one or more features of the substrate (712);

(b) expose the silicon carbide gapfill material to remote hydrogen plasma under conditions to densify and shrink the first thickness of the silicon carbide gapfill material, wherein a concentration of hydrogen for the remote hydrogen plasma is at least 15% by volume with a balance of inert carrier gas; and (c) repeat operations (a) and (b) until the one or more features of the substrate (712) are filled or substantially filled with the silicon carbide gapfill material, wherein a thickness of the silicon carbide gapfill material is between 0.5 Å and 4.5 Å per deposition-exposure cycle.

18. The apparatus of claim 17, wherein the controller (750) configured with instructions for exposing the silicon carbide gapfill material to the remote hydrogen plasma is configured with instructions for modulating at least one of a treatment time, a treatment frequency, a treatment power, or a remote plasma gas composition to remove hydrogen and increasing cross-linking in the silicon carbide gapfill material.

19. The apparatus of claim 17, wherein the controller (750) configured with instructions for exposing the silicon carbide gapfill material to the remote hydrogen plasma is configured with instructions for modulating at least one of a treatment time, a treatment frequency, a treatment power, or a remote plasma gas composition to increase a size of an opening near a top surface of each of the one or more features relative to a bottom surface of each of the one or more features.

20. The apparatus of claim 17, wherein a treatment time and a treatment power of the remote hydrogen plasma is based at least in part on a composition of the silicon carbide gapfill material.

* * * * *